(12) United States Patent
Haraguchi

(10) Patent No.: US 12,424,603 B2
(45) Date of Patent: Sep. 23, 2025

(54) CIRCUIT DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 215 days.

(21) Appl. No.: 18/551,305

(22) PCT Filed: Mar. 17, 2022

(86) PCT No.: PCT/JP2022/012470
§ 371 (c)(1),
(2) Date: Sep. 19, 2023

(87) PCT Pub. No.: WO2022/202638
PCT Pub. Date: Sep. 29, 2022

(65) Prior Publication Data
US 2024/0170472 A1    May 23, 2024

(30) Foreign Application Priority Data
Mar. 22, 2021    (JP) .................................. 2021-047315

(51) Int. Cl.
*H01L 25/00*    (2006.01)
*H01L 25/18*    (2023.01)
(Continued)

(52) U.S. Cl.
CPC ............... *H01L 25/18* (2013.01); *H05K 1/18* (2013.01); *H05K 7/20418* (2013.01);
(Continued)

(58) Field of Classification Search
CPC ...... H01L 25/18; H05K 1/18; H05K 7/20418; H05K 2201/10166; H05K 2201/10174; H05K 2201/10272; H05K 2201/10522
(Continued)

(56) References Cited

U.S. PATENT DOCUMENTS

2002/0141143 A1* 10/2002 Yamane ............. B60R 16/0238
361/601
2008/0158823 A1 7/2008 Tominaga et al.
(Continued)

FOREIGN PATENT DOCUMENTS

DE    112015005257 T5 *  8/2017   .......... H01L 23/3114
JP    H9-321395 A    12/1997
(Continued)

OTHER PUBLICATIONS

International Search Report, Application No. PCT/JP2022/012470, mailed Jun. 14, 2022. ISA/Japan Patent Office.

*Primary Examiner* — Zhengfu J Feng
(74) *Attorney, Agent, or Firm* — Honigman LLP

(57) ABSTRACT

A first heat dissipation member is thermally connected to a first busbar. A second heat dissipation member is thermally connected to a second busbar. The first busbar and the second busbar respectively have a first facing part and a second facing part that face each other. The first facing part has a first surface on which a first electronic component is mounted and a second surface opposite to the first surface. The second facing part has a third surface that faces the second surface and a fourth surface that is positioned opposite to the third surface and on which a second elec- (Continued)

tronic component is mounted. A circuit board has a wiring board that is positioned behind the first facing part and is positioned in front of the second facing part when the second facing part side is seen from the first facing part side.

13 Claims, 29 Drawing Sheets

(51) Int. Cl.
    *H05K 1/18*         (2006.01)
    *H05K 7/20*         (2006.01)

(52) U.S. Cl.
    CPC .............. *H05K 2201/10166* (2013.01); *H05K 2201/10174* (2013.01); *H05K 2201/10272* (2013.01); *H05K 2201/10522* (2013.01)

(58) Field of Classification Search
    USPC .......................................................... 361/714
    See application file for complete search history.

(56) References Cited

U.S. PATENT DOCUMENTS

| | | | |
|---|---|---|---|
| 2017/0092562 A1* | 3/2017 | Kato | H01L 23/36 |
| 2021/0013183 A1* | 1/2021 | Okaura | H01L 23/62 |
| 2021/0184447 A1* | 6/2021 | Aceña | H05K 1/181 |
| 2021/0297108 A1* | 9/2021 | Matsumoto | H03H 9/725 |

FOREIGN PATENT DOCUMENTS

| | | |
|---|---|---|
| JP | 2003-324823 A | 11/2003 |
| JP | 2008-166383 A | 7/2008 |
| JP | 2018-182148 A | 11/2018 |

\* cited by examiner

CIRCUIT DEVICE

CROSS-REFERENCE TO RELATED APPLICATIONS

This application is the U.S. national stage of PCT/JP2022/012470 filed on Mar. 17, 2022, which claims priority of Japanese Patent Application No. JP 2021-047315 filed on Mar. 22, 2021, the contents of which are incorporated herein.

TECHNICAL FIELD

The present disclosure relates to a circuit device.

BACKGROUND

JP H9-321395A discloses a heat dissipation substrate on which electronic components are mounted. JP 2008-166383A discloses a circuit device that includes a heatsink, a semiconductor switching element mounted on the heatsink, and a circuit board electrically connected to the semiconductor switching element.

Circuit devices are desired to be downsized. In the device disclosed in JP 2008-166383A, the circuit board is disposed above the semiconductor switching element. The circuit board is thus susceptible to heat generated by the semiconductor switching element, and the reliability of the circuit board may decrease.

In view of this, an object of the present disclosure is to provide a technique for increasing the reliability of a circuit board included in a circuit device while achieving downsizing of the circuit device.

SUMMARY

A circuit device of the present disclosure includes: a first electronic component; a first busbar on which the first electronic component is mounted; a second electronic component; a second busbar on which the second electronic component is mounted; a first heat dissipation member that is thermally connected to the first busbar; a second heat dissipation member that is thermally connected to the second busbar; and a circuit board that is electrically connected to the first electronic component and the second electronic component. The first busbar and the second busbar respectively have a first facing part and a second facing part that face each other. The first facing part has a first surface on which the first electronic component is mounted and a second surface opposite to the first surface. The second facing part has a third surface that faces the second surface of the first facing part and a fourth surface that is positioned opposite to the third surface and on which the second electronic component is mounted. When the second facing part side is seen from the first facing part side, the circuit board has a wiring board that is positioned behind the first facing part and is positioned in front of the second facing part.

Advantageous Effects

According to the present disclosure, it is possible to increase the reliability of a circuit board included in a circuit device while achieving downsizing of the circuit device.

DETAILED DESCRIPTION OF PREFERRED EMBODIMENTS

Figure 1:
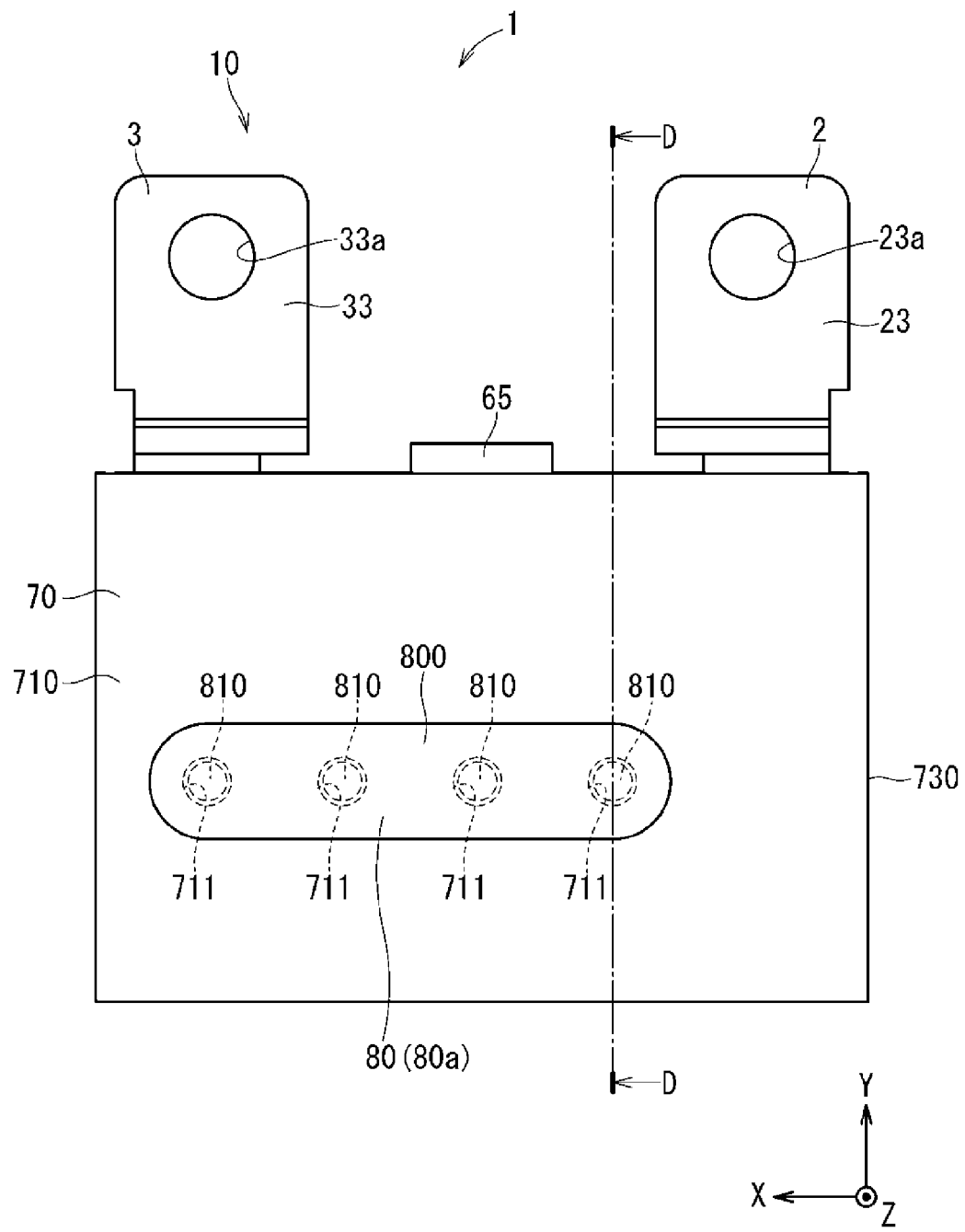
FIG. 1 is a schematic diagram showing an example of a circuit device.

First, embodiments of the present disclosure will be listed and described.

A circuit device of the present disclosure will be described below.

A circuit device of the present disclosure includes: a first electronic component; a first busbar on which the first electronic component is mounted; a second electronic component; a second busbar on which the second electronic component is mounted; a first heat dissipation member that is thermally connected to the first busbar; a second heat dissipation member that is thermally connected to the second busbar; and a circuit board that is electrically connected to the first electronic component and the second electronic component. The first busbar and the second busbar respectively have a first facing part and a second facing part that face each other. The first facing part has a first surface on which the first electronic component is mounted and a second surface opposite to the first surface. The second facing part has a third surface that faces the second surface of the first facing part and a fourth surface that is positioned opposite to the third surface and on which the second electronic component is mounted. When the second facing part side is seen from the first facing part side, the circuit board has a wiring board that is positioned behind the first facing part and is positioned in front of the second facing part. According to the present disclosure, the first electronic component and the second electronic component are respectively mounted on the first facing part and the second facing part that face each other, and thus it is possible to reduce the planar size of the circuit device as viewed from the first facing part side or the second facing part side. That is, it is possible to achieve downsizing of the circuit device. According to the present disclosure, the heat generated by the first electronic component is transferred to the first heat dissipation member through the first facing part of the first busbar, and is released to the outside from the first heat dissipation member. The heat generated by the second electronic component is transferred to the second heat dissipation member through the second facing part of the second busbar, and is released to the outside from the second heat dissipation member. When the second facing part side is seen from the first facing part side, the wiring board is positioned behind the first facing part and is positioned in front of the second facing part. The first electronic component is mounted on the first surface of the first facing part opposite to the second surface on the second facing part side, and the second electronic component is mounted on the fourth surface of the second facing part opposite to the third surface on the first facing part side. Therefore, the wiring board is positioned on the side opposite to the first electronic component with respect to the first facing part, and is positioned on the side opposite to the second electronic component with respect to the second facing part. Accordingly, the wiring board is less susceptible to heat generated by the first electronic component and to heat generated by the second electronic component. This improves the reliability of the circuit board.

The circuit device may further include a case that houses the first electronic component, the second electronic component, the first facing part, the second facing part, and the circuit board. Each of the first heat dissipation member and the second heat dissipation member may have a part positioned on the outer surface of the case. In this case, since the first heat dissipation member and the second radiation member have parts positioned on the outer surface of the case, the heat dissipation characteristics of the first heat dissipation member and the second heat dissipation member can be adjusted by adjusting the sizes of the parts without affecting the component layout in the case.

The circuit device may further include a first heat conduction material that is positioned on the first surface of the first facing part, and the first heat dissipation member may be in contact with the first heat conduction material. In this case, the first heat dissipation member is in contact with the first heat conduction material that is positioned on the first surface of the first facing part opposite to the second surface on the circuit board side. Accordingly, it is possible to shorten the heat transfer path from the first electronic component to the first heat dissipation member while avoiding interference between the first heat dissipation member and the circuit board. This improves the heat dissipation characteristics of the circuit device.

The circuit device may further include a third electronic component that is mounted on the first surface of the first facing part and a second heat conduction material that is positioned on the first surface of the first facing part. The first heat conduction material may be positioned near the first electronic component, the second heat conduction material may be positioned near the third electronic component, and the first heat dissipation member may be in contact with the first heat conduction material and the second heat conduction material. In this case, the first heat dissipation member is in contact with the first heat conduction material near the first electronic component and is in contact with the second heat conduction material near the second electronic component. Accordingly, it is possible to shorten the heat transfer path from the first electronic component to the first heat dissipation member and shorten the heat transfer path from the second electronic component to the first heat dissipation member. This increases the heat dissipation properties of the circuit device.

The first heat dissipation member may have a contact surface in contact with the first heat conduction material. The circuit device may further include a first insulating member that has an annular protruding part that surrounds a peripheral edge of the contact surface and protrudes toward the first surface past the contact surface. The first heat conduction material may have a filling part that fills a recessed part formed by the contact surface and the annular protruding part. In this case, the first heat conduction material has the filling part that fills the recessed part formed by the contact surface of the first heat dissipation member and the annular protruding part of the first insulating member. Accordingly, it is possible to appropriately bring the first heat dissipation member into contact with the first heat conduction material. This increases the heat dissipation properties of the circuit device.

The first electronic component may have a first connection terminal and a second connection terminal that are adjacent to each other. The first connection terminal and the second connection terminal may be joined by a conductive joining material to a first joining target part and a second joining target part, respectively. The circuit device may further include an insulating part that is positioned between the first connection terminal and the second connection terminal. In this case, since the insulating part is positioned between the first connection terminal and the second connection terminal, the first connection terminal and the second connection terminal are unlikely to cause a short-circuit due to the conductive joining material. Further, since the insulating part positioned between the first connection terminal and the second connection terminal regulates the positions of the first connection terminal and the second connection terminal, the first connection terminal and the second connection terminal are unlikely to be displaced when the first connection terminal and the second connection terminal are joined to the first joining target part and the second joining target part.

The first joining target part may be included in a conductive terminal that is electrically connected to the circuit board. The circuit device may further include a bent conductive piece that is joined to the conductive terminal and the circuit board and electrically connects the conductive terminal and the circuit board. In this case, the bent conductive piece is joined to the conductive terminal and the circuit board to electrically connect the conductive terminal and the circuit board. Accordingly, the bend in the conductive piece can relieve the thermal stress on the joint part of the conductive terminal and the joint part of the circuit board caused by thermal deformation of the conductive terminal and the circuit board.

DETAILS OF EMBODIMENTS OF PRESENT DISCLOSURE

Specific examples of the circuit device in the present disclosure will be described below with reference to the drawings. It should be noted that the present disclosure is not limited to the examples herein, but rather is indicated by the scope of claims, and is intended to include all modifications within a meaning and scope equivalent to the scope of claims.

Description of Outline of Circuit Device

Figure 2:
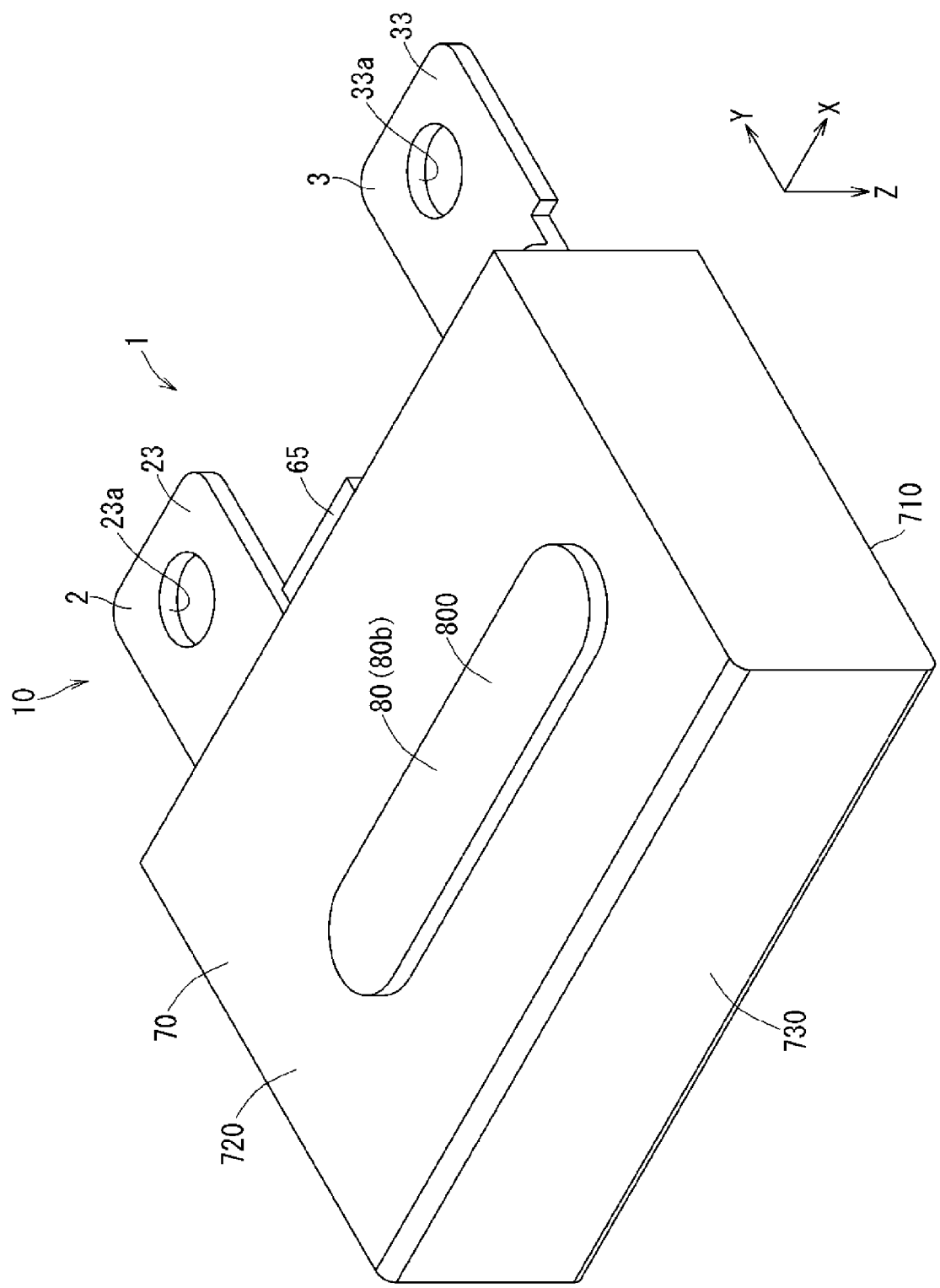
FIG. 2 is a schematic diagram showing an example of the circuit device.
Figure 3:
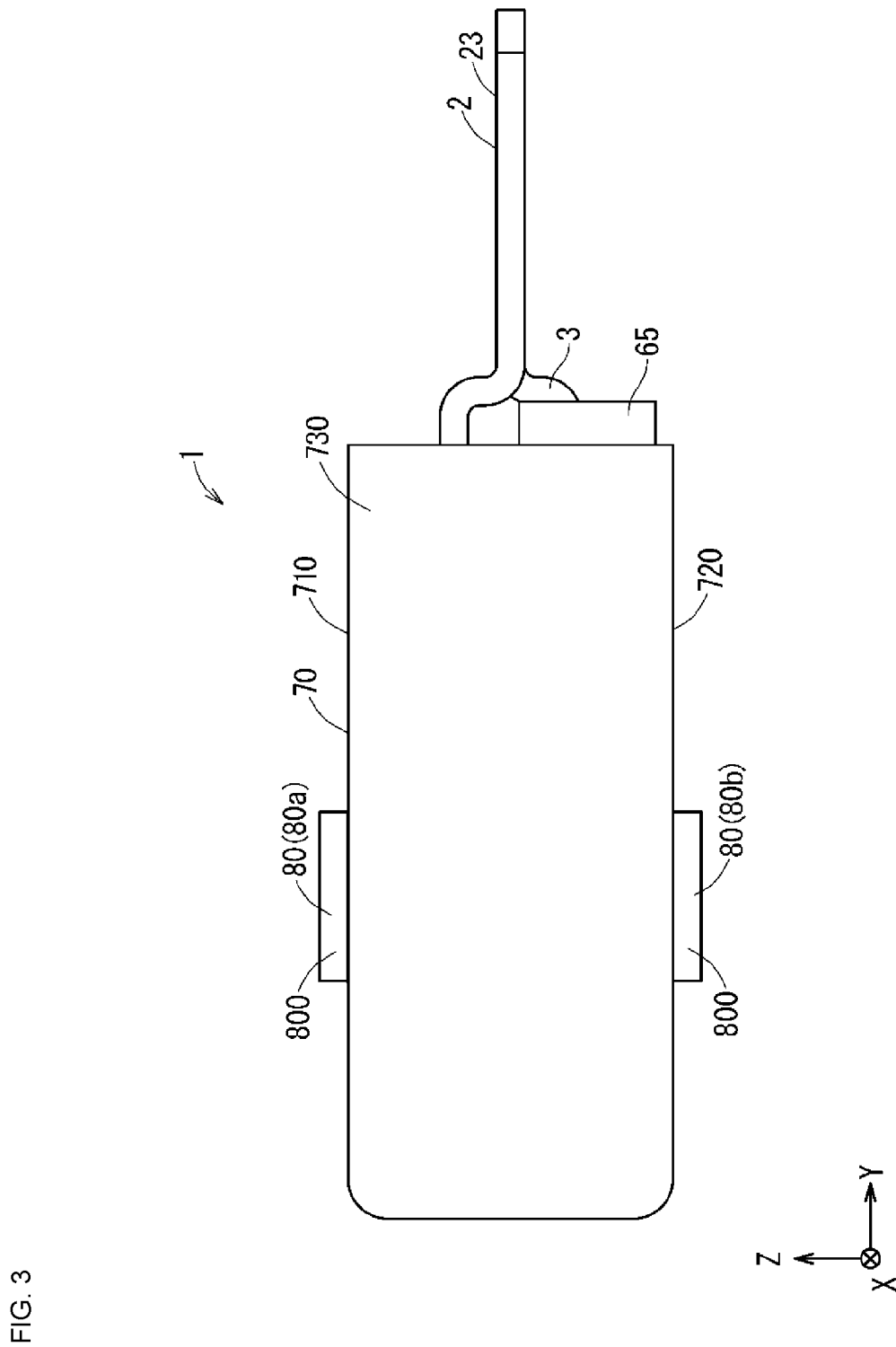
FIG. 3 is a schematic diagram showing an example of the circuit device.

FIG. 1 is a schematic plan view of an example of a circuit device 1. FIG. 2 is a schematic perspective view of an example of the circuit device 1 shown in FIG. 1 as obliquely viewed from the back side of the sheet of FIG. 1. FIG. 3 is a schematic side view of an example of the circuit device 1 shown in FIG. 1 as viewed from the right side of the sheet of FIG. 1. The circuit device 1 is provided on a power supply path between the battery and various electric components in an automobile, for example. The circuit device 1 used for this application is also called an "electrical junction box". The application of the circuit device 1 is not limited to this.

As shown in FIGS. 1 to 3, the circuit device 1 includes: a circuit structural body 10 that includes a plurality of electronic components, a circuit board, and the like; a case 70 that partially houses the circuit structural body 10; and a plurality of heat dissipation members 80 that dissipate the heat generated by the circuit structural body 10 to the outside of the circuit device 1. In this example, the circuit device 1 includes two heat dissipation members 80a and 80b, for example. The heat dissipation members 80a and 80b are fixed to the case 70, for example.

Hereinafter, the circuit device 1 will be described in detail using an XYZ orthogonal coordinate system shown in FIGS. 1 to 3 and the like. In the following description, the +Z side is defined as the upper side and the −Z side is defined as the lower side.

Schematic Description of Circuit Structural Body

Figure 4:
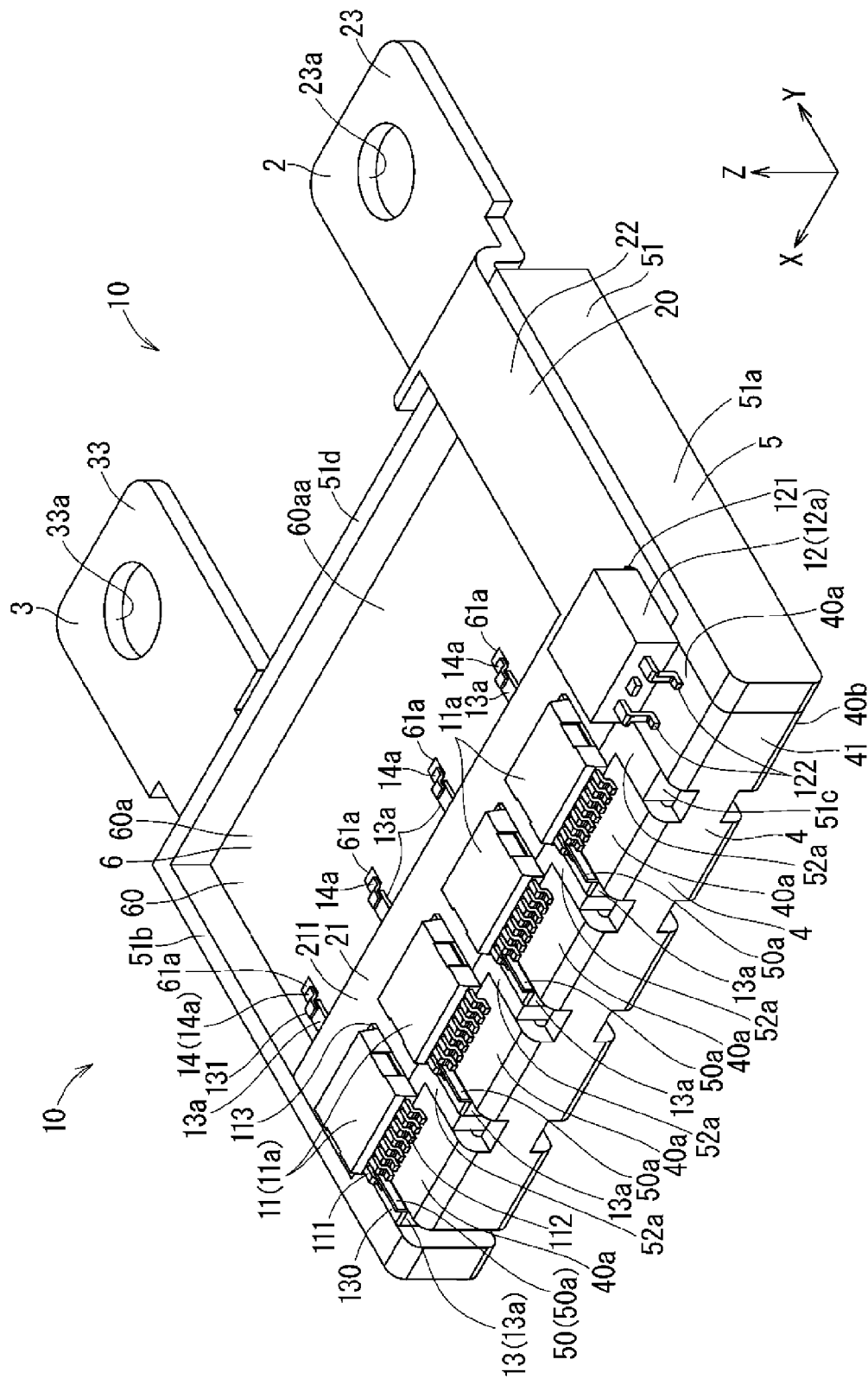
FIG. 4 is a schematic diagram showing an example of a circuit structural body.
Figure 5:
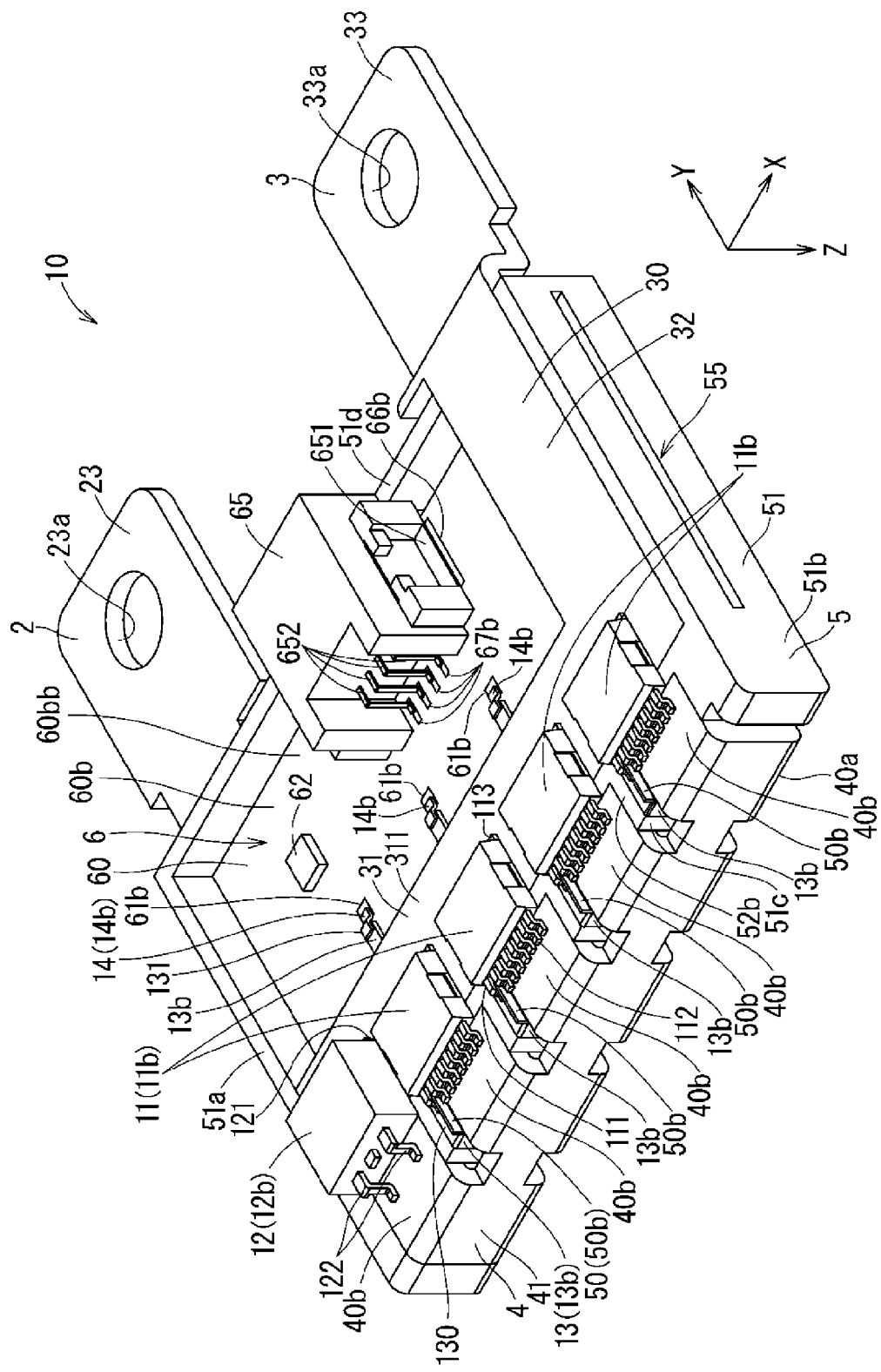
FIG. 5 is a schematic diagram showing an example of the circuit structural body.
Figure 6:
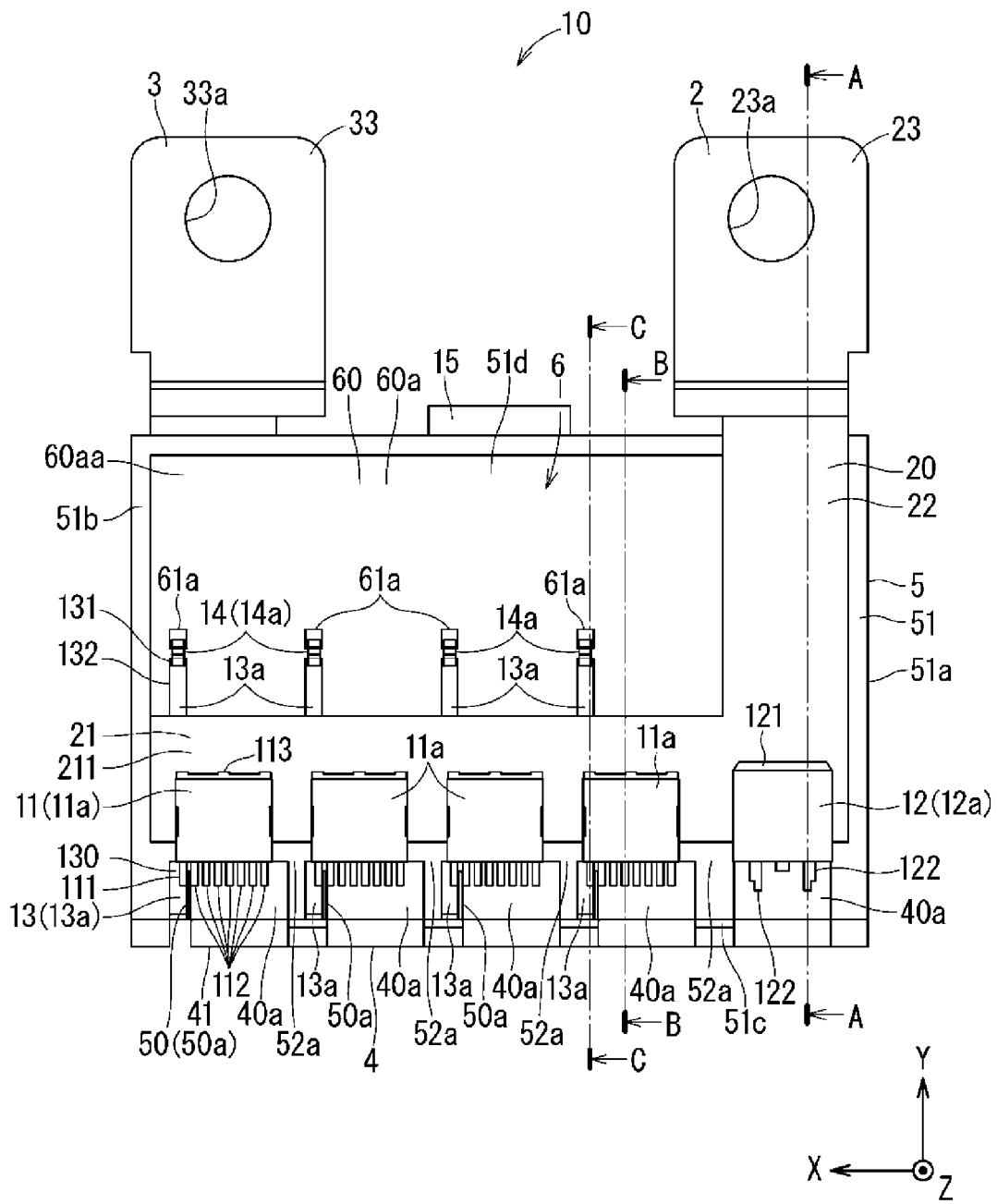
FIG. 6 is a schematic diagram showing an example of the circuit structural body.
Figure 7:
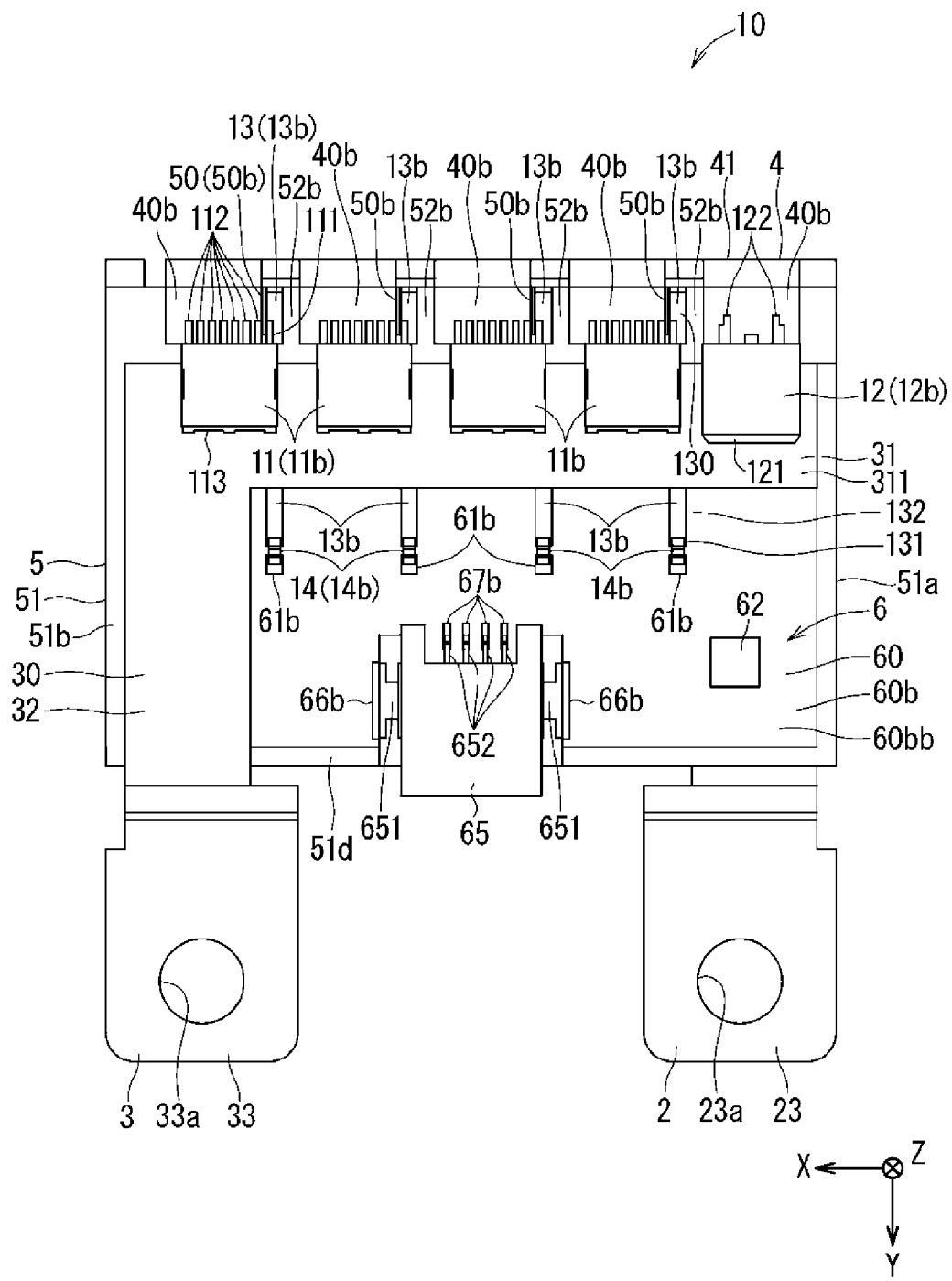
FIG. 7 is a schematic diagram showing an example of the circuit structural body.
Figure 8:
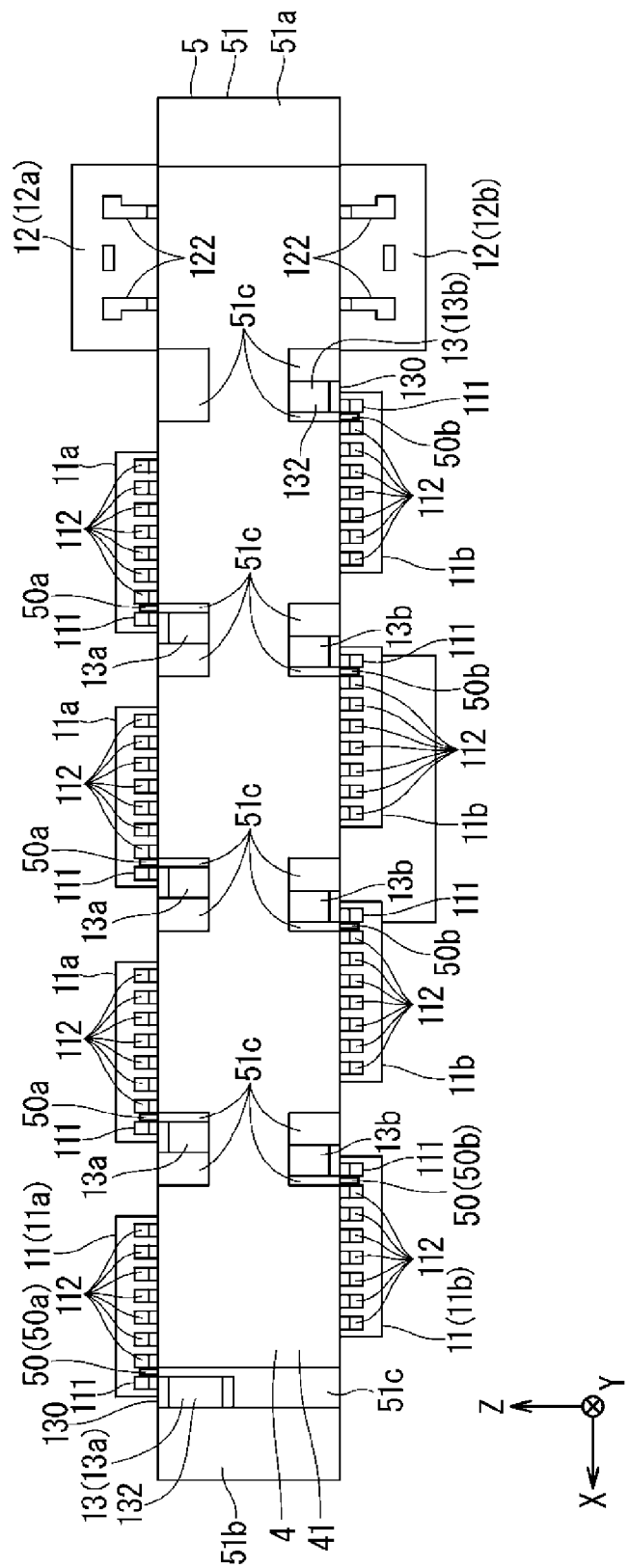
FIG. 8 is a schematic diagram showing an example of the circuit structural body.
Figure 9:
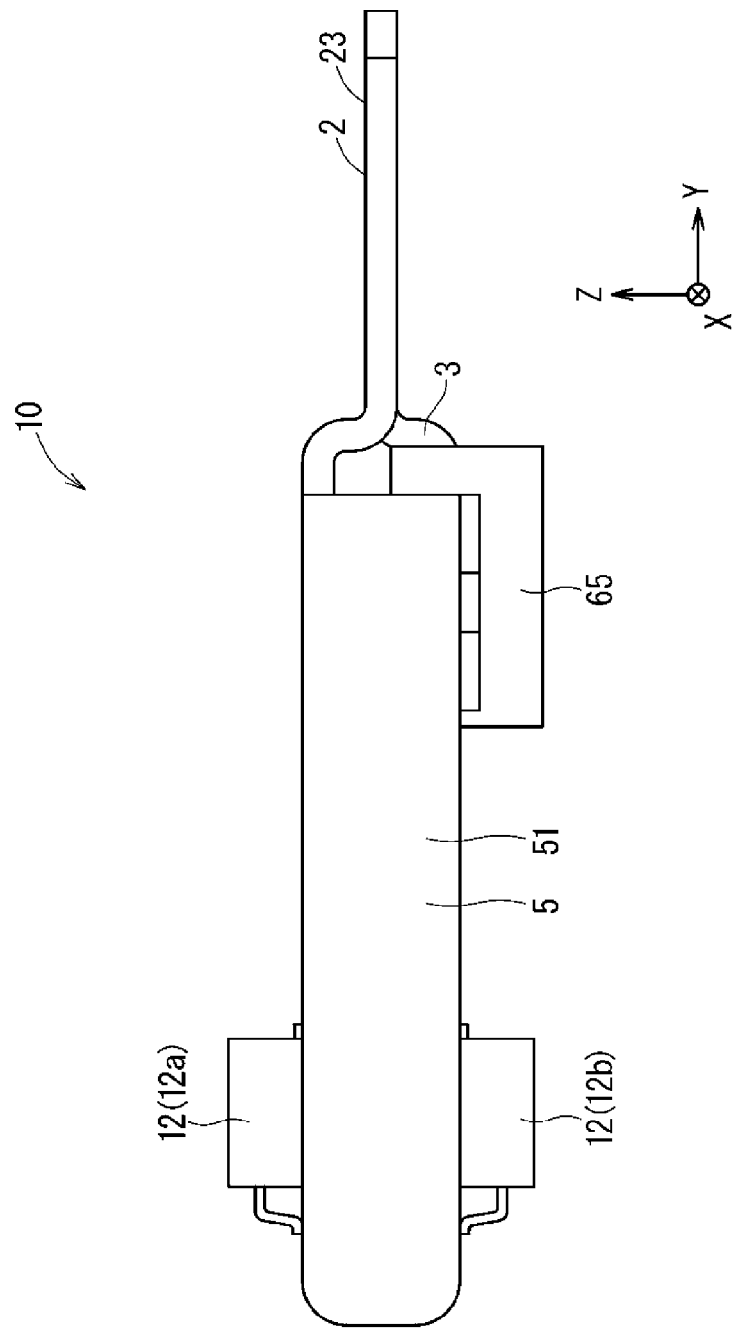
FIG. 9 is a schematic diagram showing an example of the circuit structural body.
Figure 10:
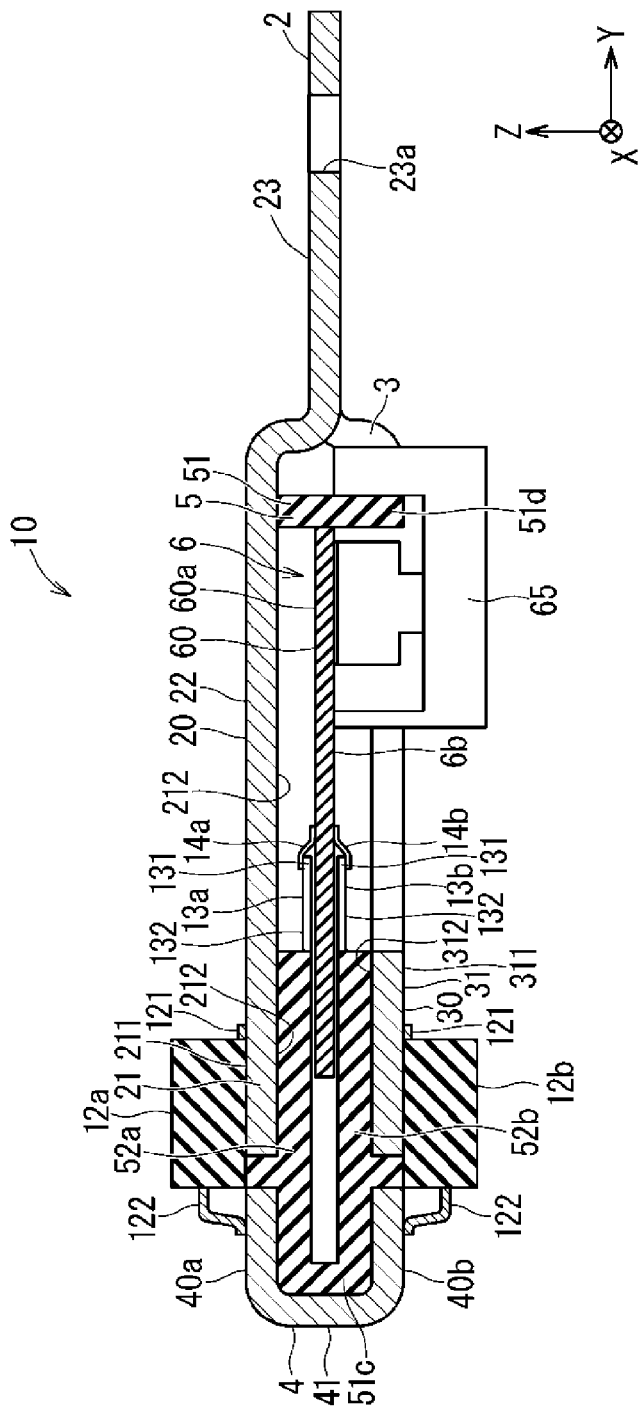
FIG. 10 is a schematic diagram showing an example of the circuit structural body.
Figure 11:
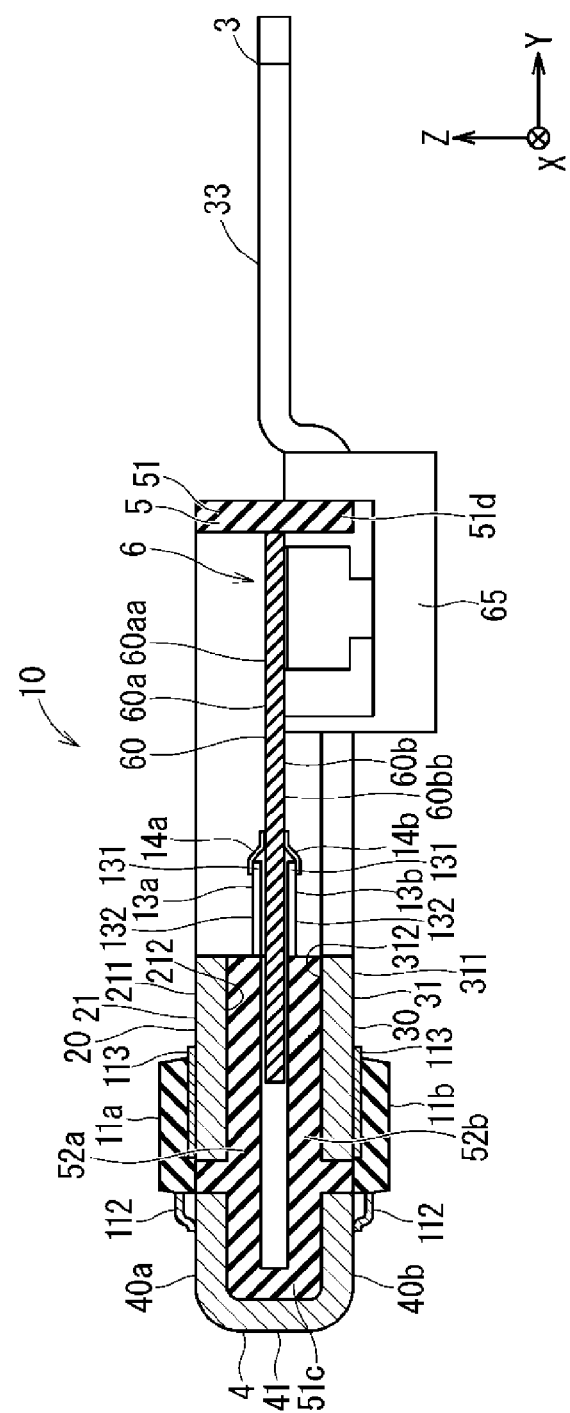
FIG. 11 is a schematic diagram showing an example of the circuit structural body.
Figure 12:
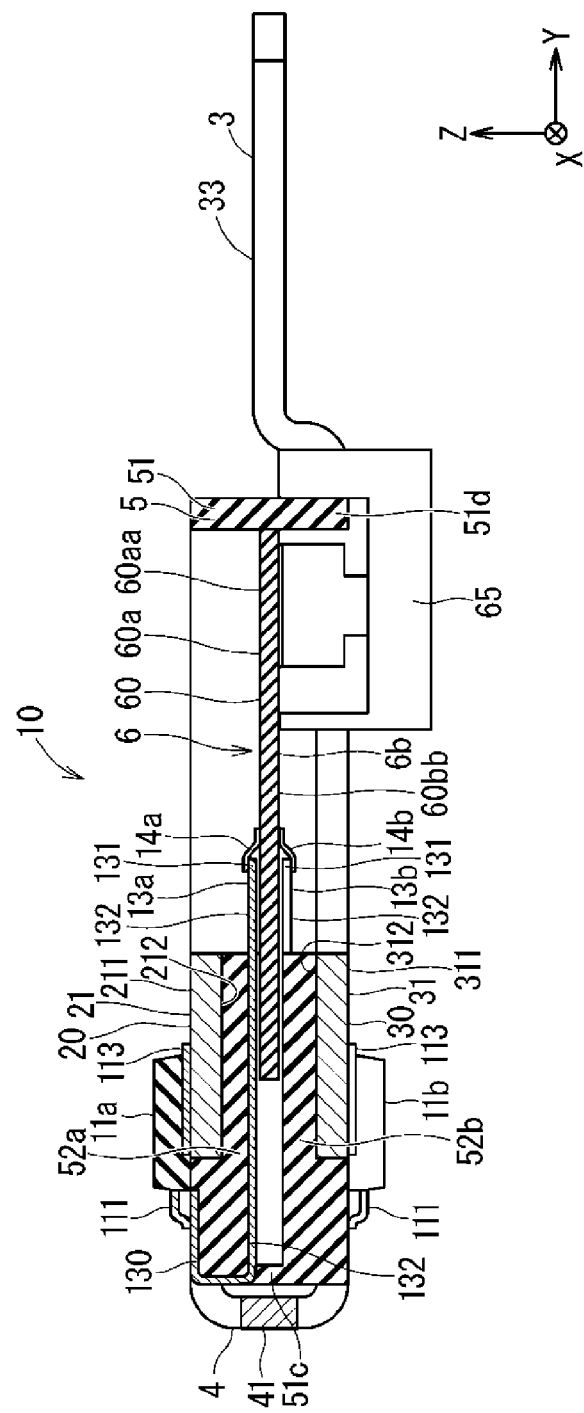
FIG. 12 is a schematic diagram showing an example of the circuit structural body.

FIGS. 4 to 12 are schematic diagrams of an example of the circuit structural body 10. FIG. 4 is a schematic perspective view of an example of the circuit structural body 10 as seen from the upper side. FIG. 5 is a schematic perspective view of an example of the circuit structural body 10 as seen from the lower side. FIG. 6 is a schematic top view of an example of the circuit structural body 10. FIG. 7 is a schematic bottom view of an example of the circuit structural body 10. FIG. 8 is a schematic diagram showing an example of the circuit structural body 10 in FIG. 6 as seen from the lower side (in other words, the −Y side) in FIG. 6. FIG. 9 is a schematic diagram showing an example of the circuit structural body 10 in FIG. 6 as seen from the right side (in other words, the −X side) in FIG. 6. FIG. 10 is a schematic diagram showing an example of a cross-section structure taken along arrow line A-A in FIG. 6. FIG. 11 is a schematic diagram showing an example of a cross-section structure taken along arrow line B-B in FIG. 6. FIG. 12 is a diagram showing an example of a cross-section structure taken along arrow line C-C in FIG. 6.

As shown in FIGS. 4 to 12, the circuit structural body 10 includes an input-side busbar 2, an output-side busbar 3, a relay busbar 4, and an insulating member 5 for insulating the input-side busbar 2, the output-side busbar 3, and the relay busbar 4 from one another. The circuit structural body 10 also includes a circuit board 6, a plurality of electronic components 11, a plurality of electronic components 12, a plurality of conductive terminals 13, and a plurality of conductive pieces 14, for example.

The input-side busbar 2 (simply called "busbar 2"), the output-side busbar 3 (simply called "busbar 3"), and the relay busbar 4 (simply called "busbar" 4) are plate-shaped metallic members, for example. The thickness of the busbars 2, 3, and 4 is 2 mm, for example. The busbar 2 includes a main body part 20 and an input terminal part 23, for example. The input terminal part 23 has a through hole 23a extending therethrough in the thickness direction. The busbar 3 includes a main body part 30 and an output terminal part 33, for example. The output terminal part 33 has a through hole 33a extending therethrough in the thickness direction. The busbar 4 is positioned near the main body part 20 of the busbar 2 and the main body part 30 of the busbar 3.

Each electronic component 11 is a switching element, for example. The electronic components 11 are metal-oxide-semiconductor field-effect transistors (MOSFET), for example. The MOSFET is a kind of semiconductor switching element. The electronic component 11 includes a drain terminal 113, a plurality of source terminals 112, and a gate terminal 111, for example. The drain terminal 113, the source terminals 112, and the gate terminal 111 can also be called "connection terminals". The plurality of electronic components 11 include a plurality of electronic components 11a that are arranged on the upper side (in other words, the +Z side) of the circuit structural body 10 and a plurality of electronic components 11b that are arranged on the lower side (in other words, the −Z side). In this example, the circuit structural body 10 includes four electronic components 11a and four electronic components 11b, for example.

Hereinafter, the electronic components 11, 11a, and 11b may also be called "MOSFETs 11, 11a, and 11b", respectively. The electronic components 11 may be switching elements other than MOSFETs. The electronic components 11 may be electronic components other than switching elements. The number of electronic components 11 included in the circuit structural body 10 is not limited to the foregoing example.

Each electronic component 12 is a diode, for example. The electronic components 12 are Zener diodes, for example. The electronic component 12 includes a cathode terminal 121 and two anode terminals 122, for example. The cathode terminal 121 and the anode terminals 122 can also be called "connection terminals". The plurality of electronic components 12 include one electronic component 12a that is arranged on the upper side of the circuit structural body 10 and one electronic component 12b that is arranged on the lower side, for example.

Hereinafter, the electronic components 12, 12a, and 12b will also be called "Zener diodes 12, 12a, and 12b", respectively. The electronic components 12 may be diodes other than Zener diodes. The electronic components 12 may be electronic components other than diodes. The number of electronic components 12 included in the circuit structural body 10 is not limited to the foregoing example.

The drain terminals 113 of the plurality of MOSFETs 11a on the upper side are electrically connected to the main body part 20 of the input-side busbar 2, for example. Accordingly, the drain terminals 113 of the plurality of MOSFETs 11a are electrically connected to one another. The source terminals 112 of the plurality of MOSFETs 11a are electrically connected to the relay busbar 4, for example. Accordingly, the source terminals 112 of the plurality of MOSFETs 11a are electrically connected to one another.

The Zener diode 12a on the upper side is an electronic component for preventing the application of an overvoltage between the drain terminals 113 and the source terminals 112 of the MOSFETs 11a. The cathode terminal 121 of the Zener diode 12a is electrically connected to the main body part 20 of the input-side busbar 2, for example. Accordingly, the cathode terminal 121 of the Zener diode 12a is electrically connected to the drain terminals 113 of the plurality of MOSFETs 11a. The anode terminals 122 of the Zener diode 12a are electrically connected to the relay busbar 4, for example. Accordingly, the anode terminals 122 of the Zener diode 12a are electrically connected to the source terminals 112 of the plurality of MOSFETs 11a.

The drain terminals 113 of the plurality of MOSFETs 11b on the lower side are electrically connected to the main body part 30 of the output-side busbar 3, for example. Accordingly, the drain terminals 113 of the plurality of MOSFETs 11b are electrically connected to one another. The source terminals 112 of the plurality of MOSFETs 11b are electrically connected to the relay busbar 4, for example. Accordingly, the source terminals 112 of the plurality of MOSFETs 11b are electrically connected to one another. The source terminals 112 of the plurality of MOSFETs 11b on the lower side are electrically connected to the source terminals 112 of the plurality of MOSFETs 11b on the upper side. The source terminals 112 of the MOSFETs 11a on the upper side and the source terminals 112 of the MOSFETs 11b on the lower side are electrically connected to each other by the relay busbar 4.

The Zener diode 12b on the lower side is an electronic component for preventing the application of an overvoltage between the drain terminals 113 and the source terminals 112 of the MOSFETs 11b. The cathode terminal 121 of the Zener diode 12b is electrically connected to the main body part 30 of the output-side busbar 3, for example. Accordingly, the cathode terminal 121 of the Zener diode 12b is electrically connected to the drain terminals 113 of the plurality of MOSFETs 11b. The anode terminals 122 of the Zener diode 12b are electrically connected to the relay busbar 4, for example. Accordingly, the anode terminals 122 of the Zener diode 12b are electrically connected to the source terminals 112 of the plurality of MOSFETs 11b.

A wiring member extending from a battery is connected to the input terminal part 23 of the input-side busbar 2 using the through hole 23a, for example. An output voltage of the battery is provided to the input terminal part 23 via the wiring member. The output voltage of the battery provided to the input terminal part 23 is then provided to the drain terminals 113 of the MOSFETs 11a via the main body part 20.

A wiring member extending from an electrical component is connected to the output terminal part 33 of the output-side busbar 3 using the through hole 33a, for example. A voltage output from the drain terminals 113 of the MOSFETs 11b on the lower side is provided to the output terminal part 33. The voltage provided to the output terminal part 33 is then provided as a power source, for example, to the electrical component via the wiring member.

The circuit board 6 can control switching operations of the plurality of MOSFETs 11, for example. The circuit board 6 is electrically connected to the gate terminals 111 of the MOSFETs 11, for example. The circuit board 6 can provide a voltage to the gate terminals 111 of the MOSFETs 11, for example. The circuit board 6 can control switching operations of the MOSFETs 11 by controlling the voltage provided to the gate terminals 111 of the MOSFETs 11, for example. The circuit board 6 can also be called a "control board".

The conductive terminals 13 and the conductive pieces 14 are members for electrically connecting the gate terminals 111 of the MOSFETs 11 to the circuit board 6. The conductive terminals 13 and the conductive pieces 14 are metallic members, for example. The plurality of conductive terminals 13 in the circuit structural body 10 include a plurality of conductive terminals 13a arranged on the upper side and a plurality of conductive terminals 13b arranged on the lower side, for example. The plurality of conductive pieces 14 in the circuit structural body 10 include a plurality of conductive pieces 14a arranged on the upper side and a plurality of conductive pieces 14b arranged on the lower side, for example.

The plurality of conductive terminals 13a on the upper side are respectively connected to the gate terminals 111 of the plurality of MOSFETs 11a on the upper side. The plurality of conductive pieces 14a on the upper side are electrically connected to the circuit board 6. The plurality of conductive pieces 14a are respectively electrically connected to the plurality of conductive terminals 13a. The conductive terminals 13a are electrically connected to the circuit board 6 via the conductive pieces 14a. The conductive terminals 13a electrically connected to the gate terminals 111 of the MOSFETs 11a are electrically connected to the circuit board 6 via the conductive pieces 14a so that the gate terminals 111 of the MOSFETs 11a are electrically connected to the circuit board 6.

The plurality of conductive terminals 13b on the lower side are respectively electrically connected to the gate terminals 111 of the plurality of MOSFETs 11b on the lower side. The plurality of conductive pieces 14b on the lower side are electrically connected to the circuit board 6. The plurality of conductive pieces 14b are respectively electrically connected to the plurality of conductive terminals 13b. The conductive terminals 13b are electrically connected to the circuit board 6 via the conductive pieces 14b. The conductive terminals 13b electrically connected to the gate terminals 111 of the MOSFETs 11b are electrically connected to the circuit board 6 via the conductive pieces 14b so that the gate terminals 111 of the MOSFETs 11b are electrically connected to the circuit board 6.

The insulating member 5 electrically insulates the busbar 2, the busbar 3, the busbar 4, and the conductive terminals 13 from one another while holding the busbars 2, 3, and 4 and the plurality of conductive terminals 13, for example. The insulating member 5 is integrally formed with the busbars 2, 3, and 4 and the plurality of conductive terminals 13, for example. The insulating member 5 is integrally molded with the busbars 2, 3, and 4 and the plurality of conductive terminals 13 through insert molding, for example.

Detailed Description of Circuit Structural Body

Configuration Example of Electronic Components

The plurality of MOSFETs 11a and the Zener diode 12a on the upper side are aligned along the X direction. Among the plurality of MOSFETs 11a and the Zener diode 12a lined up in a line, the Zener diode 12a is positioned farthest on the −X side. The plurality of MOSFETs 11b and the Zener diode 12b on the lower side are aligned along the X direction. Among the plurality of MOSFETs 11b and the Zener diode 12b lined up in a line, the Zener diode 12b is positioned farthest on the −X side.

The MOSFETs 11 are surface-mounted components, for example. The gate terminals 111, the source terminals 112, and the drain terminals 113 of the MOSFETs 11 are made of metal, for example. The gate terminals 111, the source terminals 112, and the drain terminals 113 may be made of oxygen-free copper, for example. The oxygen-free copper may be C1020 oxygen-free copper defined by Japanese Industrial Standards (JIS), for example. The gate terminals 111, the source terminals 112, and the drain terminals 113 may be made of a copper alloy or another type of metallic material.

Each MOSFET 11 includes a package in which semiconductor elements and the like are housed, for example. The drain terminal 113 has a flat plate shape, for example, and is provided on the back surface of the package. The drain terminal 113 extends slightly outward from a side surface of the package. The gate terminal 111 and the source terminals 112 are lead terminals, for example, which have a shape in which an elongated plate-like part is bent at two places. The gate terminal 111 and the source terminals 112 have a shape in which an elongated plate-like part is bent so as to form a step. The gate terminal 111 and the source terminals 112 extend outward from a side surface of the package, for example. The gate terminal 111 and the plurality of source terminals 112 are lined up in a line opposite to the side on which the drain terminal 113 extends, for example. Among the gate terminal 111 and the plurality of source terminals 112 lined up in a line, the gate terminal 111 is positioned on the outermost side.

The Zener diode 12 is a surface-mounted component, for example. The cathode terminal 121 and the anode terminals 122 of the Zener diode 12 are made of metal, for example. The cathode terminal 121 and the anode terminals 122 may be made of oxygen-free coper, for example. The oxygen-free copper may be C1020 oxygen-free copper defined by JIS, for example. The cathode terminal 121 and the anode terminals 122 may be made of a copper alloy or may be made of another kind of metallic material.

The Zener diode 12 includes a package in which semiconductor elements and the like are housed, for example. The cathode terminal 121 has a flat plate shape, for example. The cathode terminal 121 is provided on the back surface of the package. The cathode terminal 121 extends slightly outward from a side surface of the package. The anode terminals 122 are lead terminals, for example, and have a shape in which an elongated plate-like part is bent at two places. The anode terminals 122 have a shape in which an elongated plate-like part is bent so as to form a step. The anode terminals 122 extend outward from a side surface of the package. The two anode terminals 122 are arranged adjacent to each other opposite to the side on which the cathode terminal 121 extends, for example.

Configuration Example of Busbars

The busbars 2, 3, and 4 are made of copper or a copper alloy, for example. The busbars 2, 3, and 4 may be made of oxygen-free copper, for example. The oxygen-free copper may be C1020 oxygen-free copper defined according to JIS, for example. The busbars 2, 3, and 4 may be made of a metal other than copper or a copper alloy.

Figure 13:
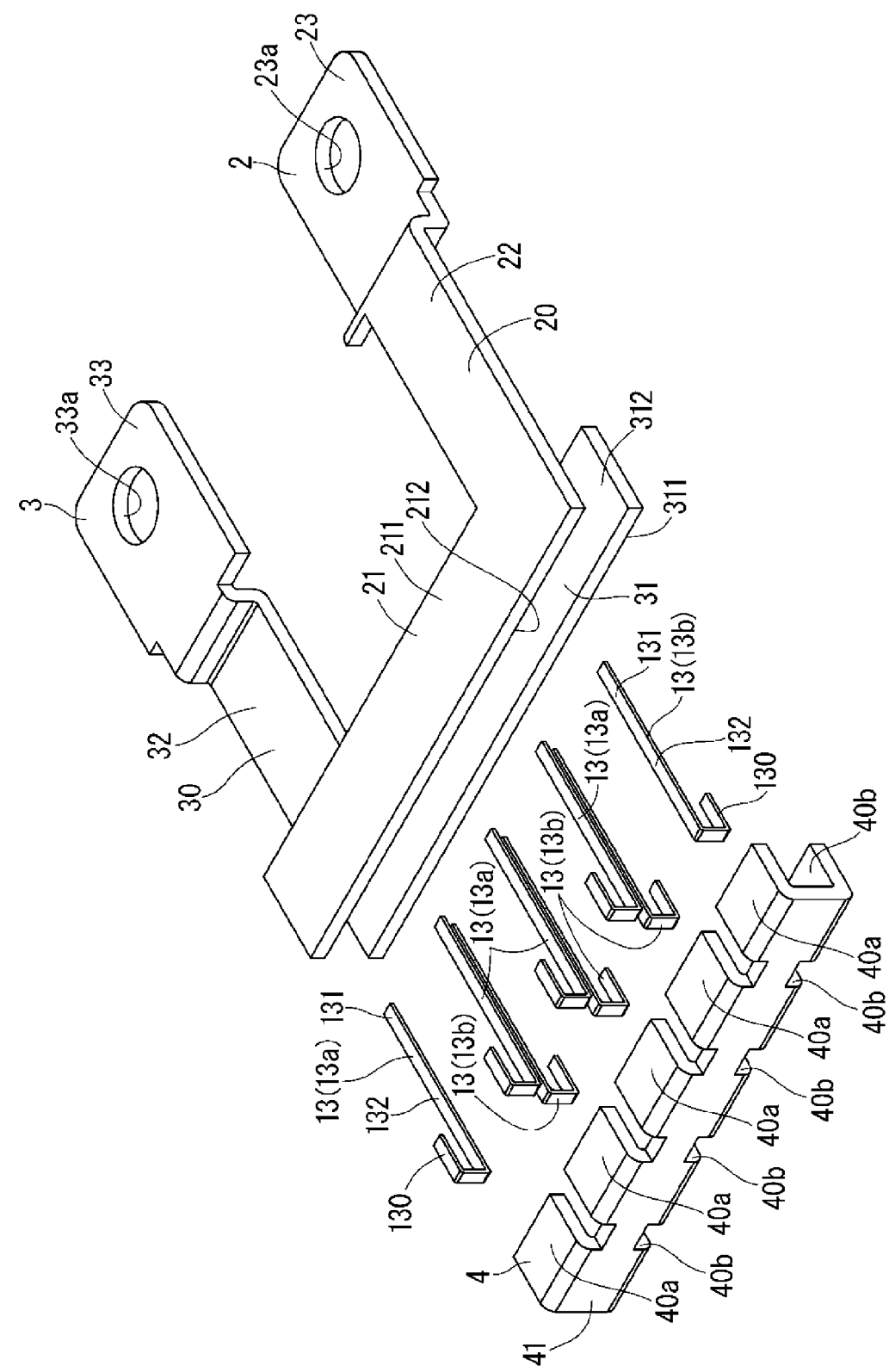
FIG. 13 is a schematic diagram showing an example of busbars and conductive terminals.

FIG. 13 is a schematic diagram showing an example of the busbars 2, 3, and 4 and the conductive terminals 13. As shown in FIGS. 4, 6, 13, and the like, the busbar 2 is formed by a substantially L-shaped plate-like member, for example. The main body part 20 of the busbar 2 is an L-shaped plate-like part, for example. The main body part 20 includes a first part 21 on which the plurality of MOSFETs 11a and the Zener diode 12a are mounted and a second part 22 that connects the first part 21 and the input terminal part 23. The first part 21 is a plate-like part that extends along the X direction, for example. The second part 22 is a plate-like part that extends along the +Y direction from the −X-side end of the first part 21. The first part 21 and the second part 22 are positioned on the same plane. The input terminal part 23 slightly extends downward from the +Y-side end of the second part 22 and then extends along the +Y direction. The boundary portion between the second part 22 and the input terminal part 23 is bent so as to form a step.

As shown in FIGS. 5, 7, 13, and the like, the busbar 3 is formed by a substantially L-shaped plate-like member, for example. The main body part 30 of the busbar 3 is an L-shaped plate-like part, for example. The main body part 30 includes a first part 31 on which the plurality of MOSFETs 11b and the Zener diode 12b are mounted and a second part 32 that connects the first part 31 and the output terminal part 33. The first part 31 is a plate-like part that extends along the X direction, for example. The second part 32 is a plate-like part that extends along the +Y direction from the +X-side end of the first part 31. The first part 31 and the second part 32 are positioned on the same plane. The output terminal part 33 extends slightly downward from the +Y-side end of the second part 32 and then extends along the +Y direction. The boundary portion between the second part 32 and the input terminal part 33 is bent so as to form a step.

The busbar 2 is positioned above the busbar 3 so as to partially face the busbar 3 in the Z direction. The first part 21 of the busbar 2 and the first part 31 of the busbar 3 face each other in the Z direction. The second part 22 of the busbar 2 is positioned farther on the −X side than the second part 32 of the busbar 3 is. In a planar view of the circuit structural body 10 from the upper side or lower side, the second part 22 extending along the Y direction and the second part 32 extending along the Y direction are parallel to each other. Hereinafter, the first part 21 and the first part 31 facing each other may also be called "facing part 21" and "facing part 31", respectively.

The plate-like facing part 21 on the upper side has a main surface 211 facing toward the outside of the circuit structural body 10 (also called "outer surface 211") and a main surface 212 facing toward the inside of the circuit structural body 10 (also called "inner surface 212"). The outer surface 211 is positioned on the +Z side, and the inner surface 212 is positioned on the −Z side. The outer surface 211 is located on the side opposite to the inner surface 212.

The plurality of MOSFETs 11a and the Zener diode 12a are mounted on the outer surface 211. The drain terminals 113 of the MOSFETs 11a and the cathode terminal 121 of the Zener diode 12a are joined to the outer surface 211 by a conductive joining material such as a solder. Accordingly, the drain terminals 113 of the plurality of MOSFETs 11a and the cathode terminal 121 of the Zener diode 12a are electrically connected to each other via the busbar 2.

The plate-like facing part 31 on the lower side has a main surface 311 facing toward the outside of the circuit structural body 10 (also called "outer surface 311") and a main surface 312 facing toward the inside of the circuit structural body 10 (also called "inner surface 312"). The outer surface 311 is positioned on the −Z side, and the inner surface 312 is positioned on the +Z side. The outer surface 311 is located on the side opposite to the inner surface 312.

The plurality of MOSFETs 11b and the Zener diode 12b are mounted on the outer surface 311. The drain terminals 113 of the plurality of MOSFETs 11b and the cathode terminal 121 of the Zener diode 12b are joined to the outer surface 311 by a conductive joining material such as a solder. Accordingly, the drain terminals 113 of the plurality of MOSFETs 11b and the cathode terminal 121 of the Zener diode 12b are electrically connected to each other via the busbar 3.

The busbar 4 overall has a shape in which a plate-like member is bent in a substantially U shape. The busbar 4 includes a plurality of flat plate-like first parts 40a, a plurality of flat plate-like second parts 40b, and a plate-like connection part 41 that connects the plurality of first parts 40a and the plurality of second parts 40b.

The plurality of first parts 40a are separated from each other and aligned along the X direction, for example. The plurality of second parts 40b are separated from each other and aligned along the X direction, for example. The plurality of first parts 40a respectively face the plurality of second parts 40b in the Z direction. The plurality of first parts 40a are positioned on the upper side, and the plurality of second parts 40b are positioned on the lower side.

The first parts 40a are positioned on the same plane as the facing part 21, for example. The first parts 40a are aligned so as to be spaced from the facing part 21 in the Y direction, for example. The second parts 40b are positioned on the same plane as the facing part 31, for example. The second parts 40b are arranged so as to be spaced from the facing part 31 in the Y direction, for example.

The plurality of first parts 40a include four first parts 40a that correspond to the four MOSFETs 11a and one first part 40a that corresponds to the Zener diode 12a, for example. The plurality of source terminals 112 of each MOSFET 11a are joined to the first part 40a that corresponds to the MOSFET 11a. The source terminals 112 of the MOSFET 11a are joined to the +Z-side main surface (also called "outer surface") of the first part 40a by a conductive joining material such as a solder. The anode terminals 122 of the Zener diode 12a are joined to the first part 40a that corresponds to the Zener diode 12a. The anode terminals 122 of the Zener diode 12a are joined to the outer surface of the first part 40a by a conductive joining material such as a solder. The source terminals 112 of the plurality of MOSFETs 11a and the anode terminals 122 of the Zener diode 12a are electrically connected to each other via the busbar 4. Hereinafter, the first parts 40a will also be called "joining target parts 40a" or "upper-side joining target parts 40a".

The plurality of second parts 40b include four second parts 40b that correspond to the four MOSFETs 11b and one second part 40b that corresponds to the Zener diode 12b, for example. The plurality of source terminals 112 of each MOSFET 11b are joined to the second parts 40b that correspond to the MOSFET 11b. The source terminals 112 of the MOSFET 11b are joined to the −Z-side main surface (also called "outer surface") of the second part 40b by a conductive joining material such as a solder. The anode terminals 122 of the Zener diode 12b are joined to the second part 40b that corresponds to the Zener diode 12b. The anode terminals 122 of the Zener diode 12b are joined to the outer surface of the second part 40b by a conductive joining material such as a solder. The source terminals 112 of the plurality of MOSFETs 11b and the anode terminals 122 of the Zener diode 12b are electrically connected to each other via the busbar 4. Hereinafter, the second parts 40b will also be called "joining target parts 40b" or "lower-side joining target parts 40b".

The connection part 41 of the busbar 4 extends along the X direction, for example. The connection part 41 connects the −Y-side ends of the plurality of joining target parts 40a and the −Y-side ends of the plurality of joining target parts 40b to each other, for example.

In order to easily solder the terminals and the like to the busbars 2, 3, and 4, in order to reduce contact resistance between the wiring member and the input terminal part 23, and in order to reduce contact resistance between the wiring member and the output terminal part 33, the busbars 2, 3, and 4 may have metal plating such as nickel plating on the surfaces thereof.

Configuration Example of Circuit Board

The circuit board 6 is electrically connected to the plurality of MOSFETs 11. The circuit board 6 includes a wiring board 60 and a plurality of components mounted on the wiring board 60. The wiring board 60 spreads along an XY plane, for example, and has an upper main surface 60a (also called "upper surface 60a") and a lower main surface 60b (also called "lower surface 60b"). The upper surface 60a is positioned on the side opposite to the lower surface 60b and faces the lower surface 60b in the Z direction.

The wiring board 60 has an insulating substrate and at least one conductive layer provided on the insulating substrate, for example. The insulating substrate may be a ceramic substrate, for example, or a substrate including a resin. In the latter case, the insulating substrate may be a glass-epoxy substrate or another substrate including a resin. The conductive layer may be made of copper, for example, or may be made of another metal.

When the facing part 31 side is seen from the facing part 21 side, the wiring board 60 is positioned behind the facing part 21 and positioned in front of the facing part 31. As seen from the upper side (in other words, the +Z side), the wiring board 60 can be said to be positioned behind the facing part 21 and positioned in front of the facing part 31. As seen from the lower side (in other words, the −Z side), the wiring board 60 can be said to be positioned behind the facing part 31 and positioned in front of the facing part 21.

The wiring board 60 has parts that are positioned between the main body part 20 of the busbar 2 and the main body part 30 of the busbar 3 in the vertical direction, for example. Specifically, the wiring board 60 includes a part that is positioned between the facing part 21 and the facing part 31 in the vertical direction and a part that is positioned between the second part 22 and the second part 32 in the vertical direction. The upper surface 60a of the wiring board 60 has an exposed area 60aa that is exposed from the busbar 2 as seen from the upper side. The lower surface 60b of the wiring board 60 has an exposed area 60bb that is exposed from the busbar 3 as seen from the lower side.

The plurality of components mounted on the wiring board 60 include a plurality of electronic components, for example. The plurality of electronic components include a microcomputer 62, for example. The plurality of components mounted on the wiring board 60 also include a connector 65, for example. The microcomputer 62 and the connector 65 are mounted in the exposed area 60*bb* of the lower surface 60*b* of the wiring board 60, for example. The microcomputer 62 has a central processing unit (CPU), a memory, and the like, for example. The microcomputer 62 can control the switching operations of the plurality of MOSFETs 11, for example.

The connector 65 is a connector for electrically connecting a device outside the circuit device 1 (also called "external device") and the circuit board 6, for example. A wiring member extending from the external device is connected to the connector 65. The connector 65 has two metallic parts 651 for fixing the connector 65 to the wiring board 60 and a plurality of connection terminals 652. The two metallic parts 651 and the plurality of connection terminals 652 are joined to the wiring board 60. The microcomputer 62 is electrically connected to the external device via the connector 65. The microcomputer 62 controls the switching operations of the MOSFETs 11 in response to instructions from the external device.

The wiring board 60 has a conductive layer positioned on the upper surface 60*a* (also called "upper conductive layer") and a conductive layer positioned on the lower surface 60*b* (also called "lower conductive layer"), for example. The upper conductive layer includes a plurality of lands 61*a* that are respectively electrically connected to the gate terminals 111 of the plurality of MOSFETs 11*a*, for example. The lower conductive layer includes a plurality of lands 61*b* that are respectively electrically connected to the gate terminals 111 of the plurality of MOSFETs 11*b*. The plurality of lands 61*a* are positioned in the exposed area 60*aa* of the upper surface 60*a* of the wiring board 60, for example. The plurality of lands 61*b* are positioned in the exposed area 60*bb* of the lower surface 60*b* of the wiring board 60, for example. The plurality of lands 61*a* and the plurality of lands 61*b* are electrically connected to a drive circuit that provides a voltage to the gate terminals 111 of the MOSFETs 11. The drive circuit is provided on the wiring board 60, and the microcomputer 62 controls the switching operations of the MOSFETs 11 through the drive circuit.

The lower conductive layer includes two lands 66*b* to which the two metallic parts 651 of the connector 65 are respectively joined and a plurality of lands 67*b* to which the plurality of connection terminals 652 of the connector 65 are respectively joined. The two lands 66*b* and the plurality of lands 67*b* are positioned in the exposed area 60*bb* of the lower surface 60*b* of the wiring board 60, for example. The metallic parts 651 of the connector 65 are joined to the lands 66*b* using a conductive joining material such as a solder. The connection terminals 652 of the connector 65 are joined to the lands 67*b* by a conductive joining material such as a solder.

At least one of the microcomputer 62 and the connector 65 may be provided on the upper surface 60*a* of the wiring board 60. The wiring board 60 may be a single-layer board or a multi-layer board. The wiring board 60 may have a conductive layer serving as an inner layer.

Configuration Example of Conductive Terminals

The plurality of conductive terminals 13 include a plurality of conductive terminals 13*a* to which the gate terminals 111 of the plurality of MOSFETs 11*a* are joined and a plurality of conductive terminals 13*b* to which the gate terminals 111 of the plurality of MOSFETs 11*b* are joined. The conductive terminals 13 may be made of a copper alloy, for example, or may be made of another metallic material.

The conductive terminals 13 have a shape in which one end portion of an elongated plate-like member is bent in a substantially U shape, for example. The thickness of the conductive terminals 13 is 0.6 mm, for example. Each conductive terminal 13 has a joining target part 130 at one end that is joined to the gate terminal 111 of the corresponding MOSFET 11. The conductive terminal 13 also has a joining target part 131 at the other end to which the corresponding conductive piece 14 is joined. The conductive terminal 13 includes a connection part 132 that connects the joining target part 130 and the joining target part 131.

The joining target part 130 is a flat plate-like part that extends along the Y direction, for example. The joining target part 130 of the upper conductive terminal 13*a* is positioned on the −Z side of the gate terminal 111 of the MOSFET 11*a*. The joining target part 130 of the lower conductive terminal 13*b* is positioned on the +Z side of the gate terminal 111 of the corresponding MOSFET 11*b*. The flat plate-like joining target part 130 has a pair of opposing main surfaces. One main surface of the joining target part 130 of the conductive terminal 13*a* is positioned on the same plane as the +Z-side main surface of the upper-side joining target part 40*a* of the busbar 4, for example. The gate terminal 111 of the MOSFET 11*a* is joined to the one main surface of the joining target part 130 of the conductive terminal 13*a* using a conductive joining material such as a solder. One main surface of the joining target part 130 of the conductive terminal 13*b* is positioned on the same plane as the −Z-side main surface of the lower joining target part 40*b* of the busbar 4, for example. The gate terminal 111 of the MOSFET 11*b* is joined to the one main surface of the joining target part 130 of the conductive terminal 13*b* by a conductive joining material such as a solder.

The joining target part 131 is a flat plate-like part, for example. The flat plate-like joining target part 131 has a pair of opposing main surfaces. The joining target part 131 of the upper conductive terminal 13*a* is positioned above the upper surface 60*a* of the wiring board 60 so as to be slightly separated from the upper surface 60*a*. The one main surface of the joining target part 131 of the conductive terminal 13*a* faces the upper surface 60*a* of the wiring board 60. The joining target part 131 of the conductive terminal 13*a* is positioned near the land 61*a* of the wiring board 60 on the −Y side of the land 61*a*.

The joining target part 131 of the conductive terminal 13*b* is positioned above the lower surface 60*b* of the wiring board 60 so as to be slightly separated from the lower surface 60*b*. The one main surface of the joining target part 131 of the conductive terminal 13*b* faces the lower surface 60*b* of the wiring board 60. The joining target part 131 of the conductive terminal 13*b* is positioned near the land 61*b* of the wiring board 60 on the −Y side of the land 61*b*.

The connection part 132 has a shape in which one end portion of an elongated plate-like part is bent in an L shape, for example. The connection part 132 of the conductive terminal 13*a* slightly extends to the −Z side from the −Y-side end of the joining target part 130 of the conductive terminal 13*a*, then extends along the +Y direction, and is connected to the −Y-side end of the joining target part 131 of the conductive terminal 13*a*. The connection part 132 of the conductive terminal 13*b* slightly extends to the +Z side from the −Y-side end of the joining target part 130 of the conductive terminal 13*b*, then extends along the +Y direction, and is connected to the −Y-side end of the joining target part 131 of the conductive terminal 13*b*.

To facilitate soldering of the members to the conductive terminals 13, the conductive terminals 13 may have metallic plating such as nickel plating on the surfaces thereof.

Configuration Example of Conductive Pieces

The plurality of conductive pieces 14 include a plurality of conductive pieces 14a to which the plurality of conductive terminals 13a are respectively joined and a plurality of conductive pieces 14b to which the plurality of conductive terminals 13b are respectively joined. The conductive pieces 14 may be made of a copper alloy, for example, or may be made of another metallic material.

As shown in FIGS. 10 to 12 and the like, the conductive pieces 14 have a shape in which a plate-like member is bent at two places, for example. The conductive pieces 14 overall have a shape in which a plate-like member is bent so as to form a step, for example. The conductive pieces 14 can also be called "bent conductive pieces 14". The conductive pieces 14 are thinner than the conductive terminals 13, for example. The conductive pieces 14a are members for electrically connecting the conductive terminals 13a and the lands 61a. The conductive pieces 14b are members for electrically connecting the conductive terminals 13b and the lands 61b. The conductive pieces 14 are also called "jumper chips".

Each conductive piece 14a is disposed spanning from the joining target part 131 of the conductive terminal 13a to the land 61a of the wiring board 60. The conductive piece 14a has an on-terminal part that is positioned on the joining target part 131 of the conductive terminal 13a. The on-terminal part of the conductive piece 14a is joined to the joining target part 131 of the conductive terminal 13a using a conductive joining material such as a solder. The conductive piece 14a has an on-land part that is positioned on the land 61a of the wiring board 60. The on-land part of the conductive piece 14a is joined to the land 61a using a conductive joining material such as a solder. The conductive piece 14a has an inclined part that connects the on-terminal part and the on-land part. The conductive piece 14a is bent at the boundary between the on-terminal part and the inclined part, and is bent at the boundary between the inclined part and the on-land part.

Each conductive piece 14b is disposed spanning from the joining target part 131 of the conductive terminal 13b to the land 61b of the wiring board 60. The conductive piece 14b has an on-terminal part that is positioned on the joining target part 131 of the conductive terminal 13b. The on-terminal part of the conductive piece 14b is joined to the joining target part 131 of the conductive terminal 13b using a conductive joining material such as a solder. The conductive piece 14b has an on-land part that is positioned on the land 61b of the wiring board 60. The on-land part of the conductive piece 14b is joined to the land 61b using a conductive joining material such as a solder. The conductive piece 14b has an inclined part that connects the on-terminal part and the on-land part. The conductive piece 14b is bent at the boundary between the on-terminal part and the inclined part, and is bent at the boundary between the inclined part and the on-land part.

As described above, in this example, the conductive pieces 14 are joined to the conductive terminals 13 and the circuit board 6 to electrically connect the conductive terminals 13 and the circuit board 6. Accordingly, the bends in the conductive pieces 14 can relieve thermal stress on the joint parts of the conductive terminals 13 and the joint parts of the circuit board 6 caused by thermal deformation of the conductive terminals 13 and the circuit board 6.

Configuration Example of Insulating Member

The insulating member 5 is made of an insulating resin, for example. The insulating member 5 may be made of a polyphenylene sulfide (PPS) resin, for example. The insulating member 5 is integrally molded with the busbars 2, 3, and 4 and the plurality of conductive terminals 13, for example.

The insulating member 5 includes a substantially frame-shaped insulating part 51, an insulating part 52a that has a portion positioned between the busbar 2 and the busbar 4, and an insulating part 52b that has a portion positioned between the busbar 3 and the busbar 4.

The substantially frame-shaped insulating part 51 surrounds the main body part 20 of the busbar 2, the main body part 30 of the busbar 3, and the circuit board 6. The insulating part 51 includes a first part 51a and a second part 51b that extend along the Y direction and face each other in the X direction, and a third part 51c and a fourth part 51d that extend along the X direction and face each other in the Y direction.

The first part 51a is flat plate-shaped, extends along the −X-side end surface of the second part 22 of the main body part 20, and is attached to the end surface. The second part 51b is flat plate-shaped, extends along the +X-side end surface of the second part 32 of the main body part 30, and is attached to the end surface. The third part 51c overall has a flat plate shape, extends along the inner surface of the connection part 41 of the busbar 4, and is attached to the inner surface. The fourth part 51d is flat plate-shaped and extends along the +Y-side end surface of the wiring board 60.

As shown in FIG. 5, the second part 51b is provided with a slit 55 extending along the Y direction. As described later, when manufacturing of the circuit structural body 10, the wiring board 60 is inserted through the slit 55 into the substantially frame-shaped insulating part 51.

The insulating parts 52a and 52b overall have flat plate shapes, for example. The insulating parts 52a and 52b extend from the first part 51a to the second part 51b of the insulating part 51 so as to face each other in the Z direction. The −Y-side ends of the insulating parts 52a and 52b are connected to the third part 51c of the insulating part 51. The +Y-side end surfaces of the insulating parts 52a and 52b are positioned on the same plane as the +Y-side end surface of the facing part 21 of the busbar 2 and the +Y-side end surface of the facing part 31 of the busbar 3, for example. The insulating part 52a is positioned farther on the +Z side than the wiring board 60 is, and the insulating part 52b is positioned farther on the −Z side than the wiring board 60 is.

The upper insulating part 52a has a first part that spreads along the −Z-side main surface of the facing part 21 of the busbar 2 and the −Z-side main surfaces of the plurality of upper joining target parts 40a of the busbar 4, and is attached to the main surfaces. The insulating part 52a also has a second part that is positioned between the −Y-side end surface of the facing part 21 of the busbar 2 and the +Y-side end surfaces of the upper joining target parts 40a of the busbar 4. In this example, as shown in FIG. 10 and the like, the packages of the MOSFETs 11a are positioned not only on the facing part 21 but also on the second part of the upper insulating part 52a.

The lower insulating part 52b has a first part that spreads along the +Z-side main surface of the facing part 31 of the busbar 3 and the +Z-side main surfaces of the plurality of lower joining target parts 40*b* of the busbar 4, and is attached to the main surfaces. The insulating part 52*b* also has a second part that is positioned on the −Y-side end surface of the facing part 31 of the busbar 3 and the +Y-side end surfaces of the lower joining target parts 40*b* of the busbar 4. In this example, as shown in FIG. 10 and the like, the packages of the MOSFETs 11*b* are positioned not only on the facing part 31 but also on the second part of the insulating part 52*b*.

As shown in FIGS. 4, 6, 8, and the like, in this example, among the four conductive terminals 13*a*, the three conductive terminals 13*a* other than the conductive terminal 13*a* positioned farthest on the +X side each have a part that is positioned between two adjacent upper joining target parts 40*a*. The insulating member 5 includes an insulating part that is positioned between two adjacent upper joining target parts 40*a* in order to provide electrical insulation between the conductive terminal 13*a* having a part positioned between the two upper joining target parts 40*a* and the two upper joining target parts 40*a*. This insulating part is included in the third part 51*c* of the insulating part 51 and the insulating part 52*a*. Among the four conductive terminals 13*a*, the conductive terminal 13*a* positioned farthest on the +X side has a part that faces the +X-side end surface of the upper joint target part 40*a*. The insulating member 5 has an insulating part that is positioned between the conductive terminal 13*a* positioned farthest on the +X side and the +X-side end surface of the upper joining target part 40*a* in order to provide electrical insulation between the conductive terminal 13*a* positioned farthest on the +X side and the upper joining target part 40*a*. The insulating part is included in the third part 51*c* of the insulating part 51 and the insulating part 52*a*.

As shown in FIGS. 5, 7, 8, and the like, in this example, each of the four conductive terminals 13*b* has a part that is positioned between two adjacent lower joining target parts 40*b*. The insulating member 5 includes an insulating part that is positioned between two lower joining target parts 40*b* in order to provide electrical insulation between the conductive terminal 13*b* having a part positioned between the two lower joining target parts 40*b* and the two lower joining target parts 40*b*. The insulating part is included in the third part 51*c* of the insulating part 51 and the insulating part 52*b*.

The insulating member 5 includes a plurality of insulating parts 50 in addition to the insulating parts 51, 52*a*, and 52*b*. The plurality of insulating parts 50 include a plurality of insulating parts 50*a* corresponding to the plurality of MOSFETs 11*a* and a plurality of insulating parts 50*b* corresponding to the plurality of MOSFETs 11*b*.

Figure 14:
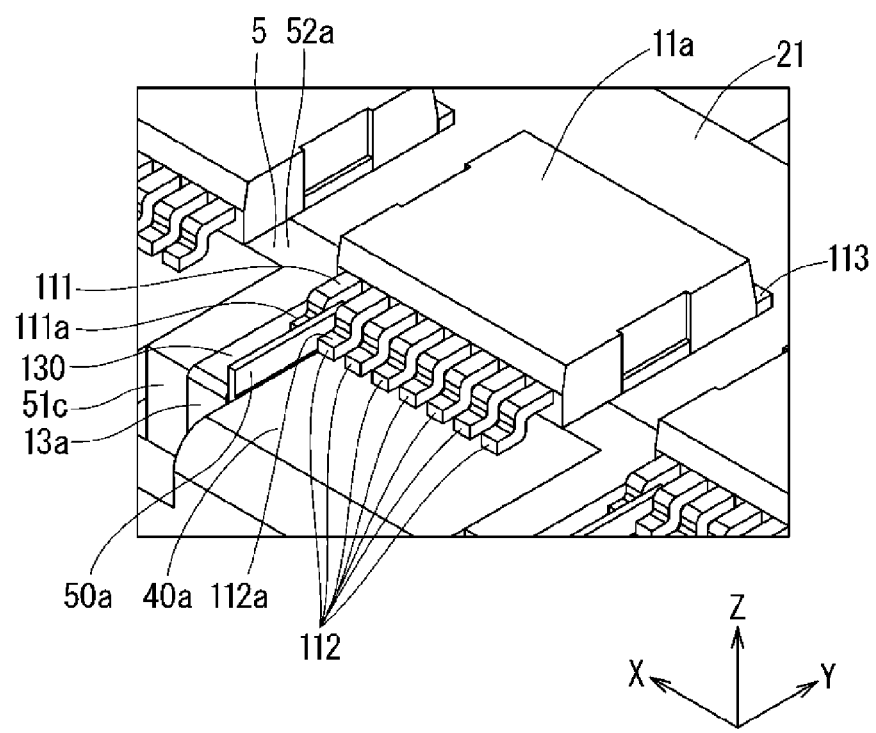
FIG. 14 is a partially enlarged schematic diagram showing an example of the circuit structural body.

FIG. 14 is an enlarged schematic diagram showing an example of a surrounding region of a MOSFET 11*a*. Each insulating part 50*a* is positioned between the gate terminal 111 and the source terminal 112 next to the gate terminal 111 of the corresponding MOSFET 11*a*. The insulating part 50*a* has a portion that is positioned between the gate terminal 111 and the source terminal 112 next to the gate terminal 111. The insulating part 50*a* is a thin plate-like part, for example. The insulating part 50*a* extends to the +Z side from the portion of the insulating member 5 positioned between the conductive terminal 13*a* and the +X-side end surface of the upper joining target part 40*a*. The protrusion distance of the insulating part 50*a* from the joining target part 130 of the conductive terminal 13*a* and the +Z-side surface of the upper joining target part 40*a* is greater than the thickness of the gate terminal 111 and the source terminal 112 of the MOSFET 11*a*. The protrusion distance is about 1 mm, for example. The insulating part 50*a* has a portion that is positioned between a leading end part 111*a* of the gate terminal 111 joined to the conductive terminal 13*a* and a leading end part 112*a* of the source terminal 112 joined to the upper joining target part 40*a*, for example.

Each insulating part 50*b* is positioned between the gate terminal 111 and the source terminal 112 next to the gate terminal 111 of the corresponding MOSFET 11*b*. The insulating part 50*b* has a portion that is positioned in a gap between the gate terminal 111 and the source terminal 112 next to the gate terminal 111. The insulating part 50*b* is a thin plate-like part, for example. The insulating part 50*b* extends to the −Z side from a portion of the insulating member 5 that is positioned between the conductive terminal 13*b* and the −X-side end surface of the lower joining target part 40*b*. The protrusion distance of the insulating part 50*b* from the joining target part 130 of the conductive terminal 13*b* and the −Z-side surface of the lower joining target part 40*b* is greater than the thickness of the gate terminal 111 and the source terminal 112 of the MOSFET 11*b*. The protrusion distance is about 1 mm, for example. The insulating part 50*b* has a portion that is positioned between a leading end part 111*a* of the gate terminal 111 joined to the conductive terminal 13*b* and a leading end part 112*a* of the source terminal 112 joined to the lower joining target part 40*b*.

A case where the circuit structural body 10 does not include the insulating part 50 unlike in this example will be discussed. In this case, a conductive joining material such as a solder for joining the gate terminal 111 and the source terminal 112 next to the gate terminal 111 to the joining target part may flow into a space between the gate terminal 111 and the source terminal 112 next to the gate terminal 111 to cause a short-circuit between the gate terminal 111 and the source terminal 112 next to the gate terminal 111. In addition, when the gate terminal 111, the source terminals 112, and the drain terminal 113 of the MOSFET 11 are soldered using a reflow method, for example, solder may flow into a space between the gate terminal 111 and the source terminal 112, and change the position of the MOSFET 11 thus causing displacement of the gate terminal 111 and the source terminal 112.

In this example, the insulating part 50 is positioned between the gate terminal 111 and the source terminal 112 next to the gate terminal 111, thereby reducing the likelihood of a short-circuit occurring between the gate terminal 111 and the source terminal 112 due to a conductive joining material such as a solder. Further, the insulating part 50 regulates the positions of the gate terminal 111 and the source terminal 112 so that the gate terminal 111 and the source terminal 112 are unlikely to be displaced when the gate terminal 111 and the source terminal 112 are joined to the joining target part.

Example of Method for Manufacturing Circuit Structural Body

In order to manufacture the circuit structural body 10 configured as described above, first, a busbar material is subjected to cold heading or cutting processing, for example, to fabricate the busbars 2, 3, and 4. In addition, a metallic plate is subjected to pressing processing, for example, to fabricate the plurality of conductive terminals 13. The surfaces of the fabricated busbars 2, 3, and 4 and the conductive terminals 13 may be coated with a metallic plating such as nickel plating through electroplating or chemical deposition, for example.

Figure 15:
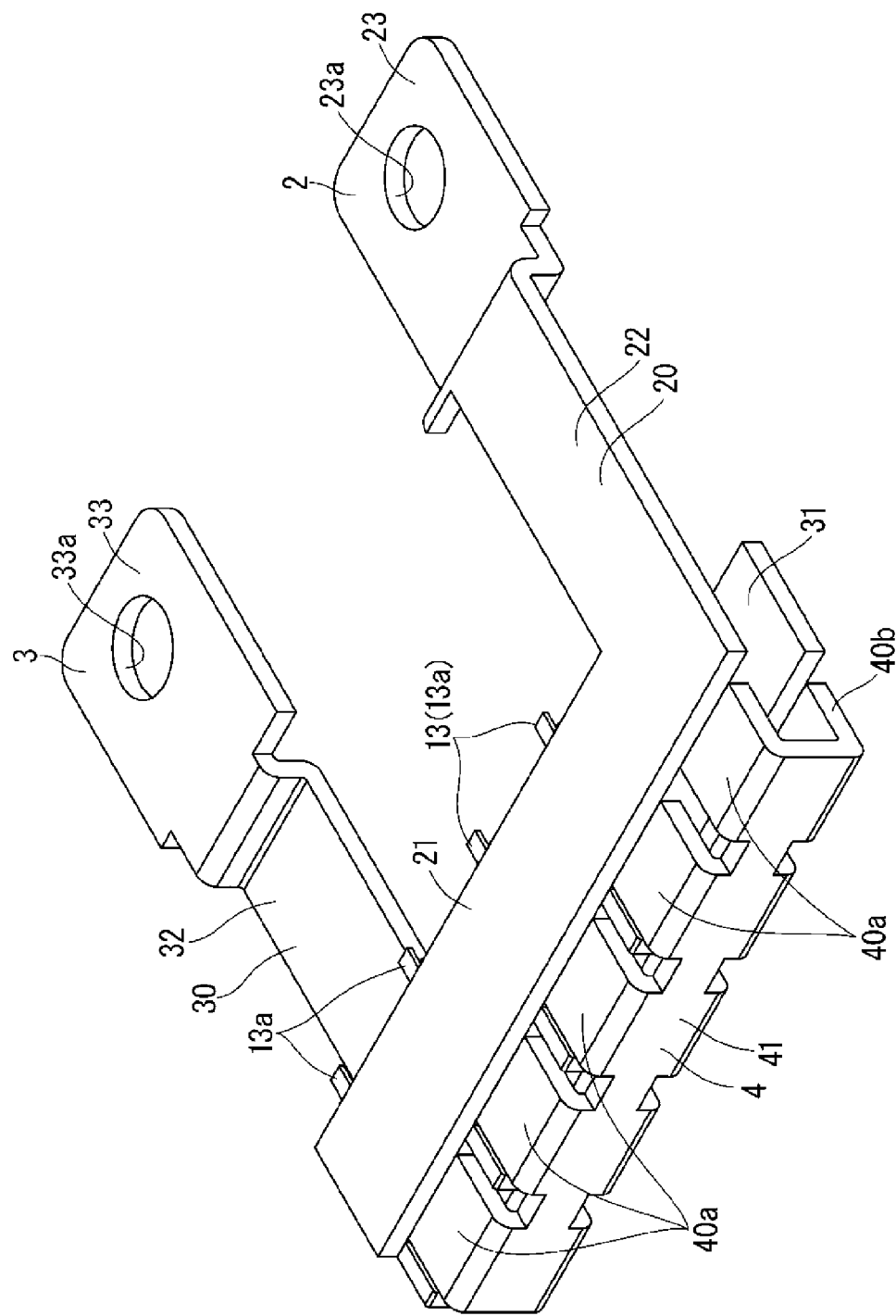
FIG. 15 is a schematic diagram for describing an example of a method for manufacturing the circuit structural body.
Figure 16:
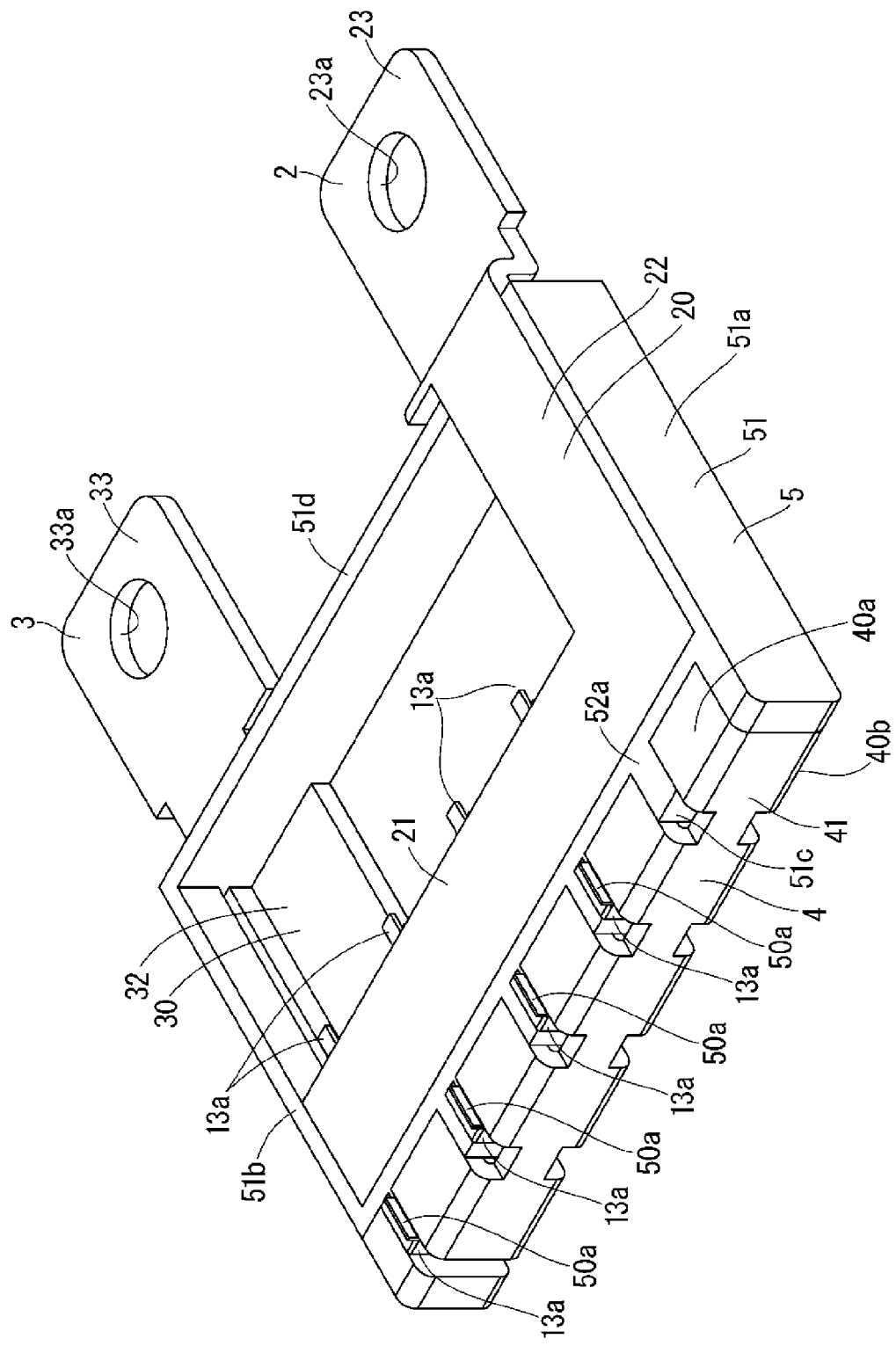
FIG. 16 is a schematic diagram for describing an example of the method for manufacturing the circuit structural body.
Figure 17:
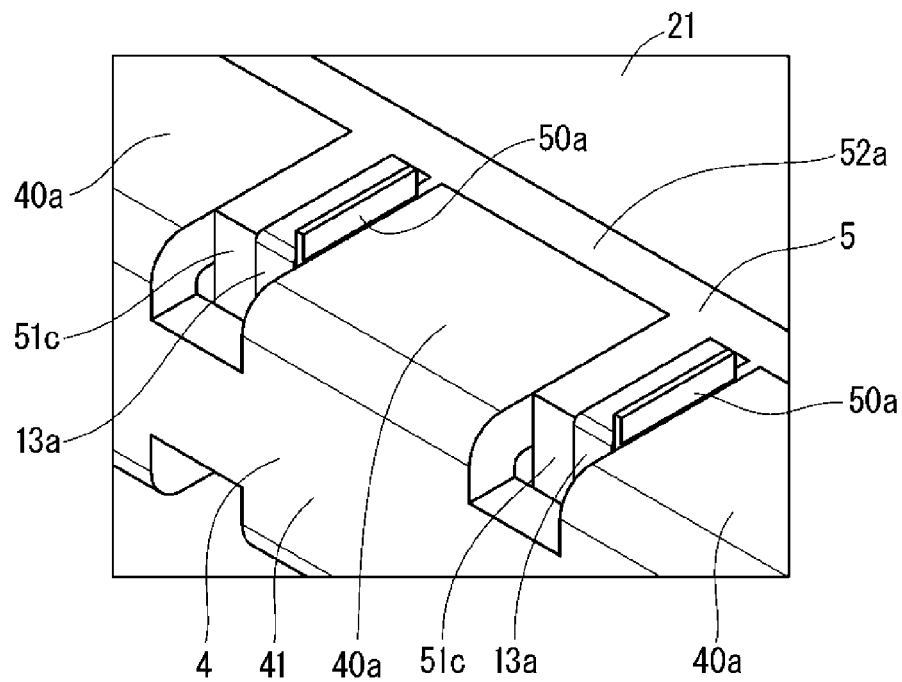
FIG. 17 is a schematic diagram for describing an example of the method for manufacturing the circuit structural body.

Next, as shown in FIG. 15, the busbars 2, 3, and 4 and the plurality of conductive terminals 13 are arranged in an insert molding die. FIG. 15 does not show the insert molding die. Then, a thermoplastic resin that has excellent heat resistance, such as a PPS resin is injected by an injection molding machine into the insert molding die to integrally mold the busbars 2, 3, and 4 and the plurality of conductive terminals 13. Accordingly, as shown in FIG. 16, an integrated molded article is obtained in which the busbars 2, 3, and 4, the plurality of conductive terminals 13, and the insulating member 5 are integrally molded. FIG. 17 is an enlarged schematic diagram showing an example of a surrounding region of the insulating part 50a included in the insulating member 5.

Figure 18:
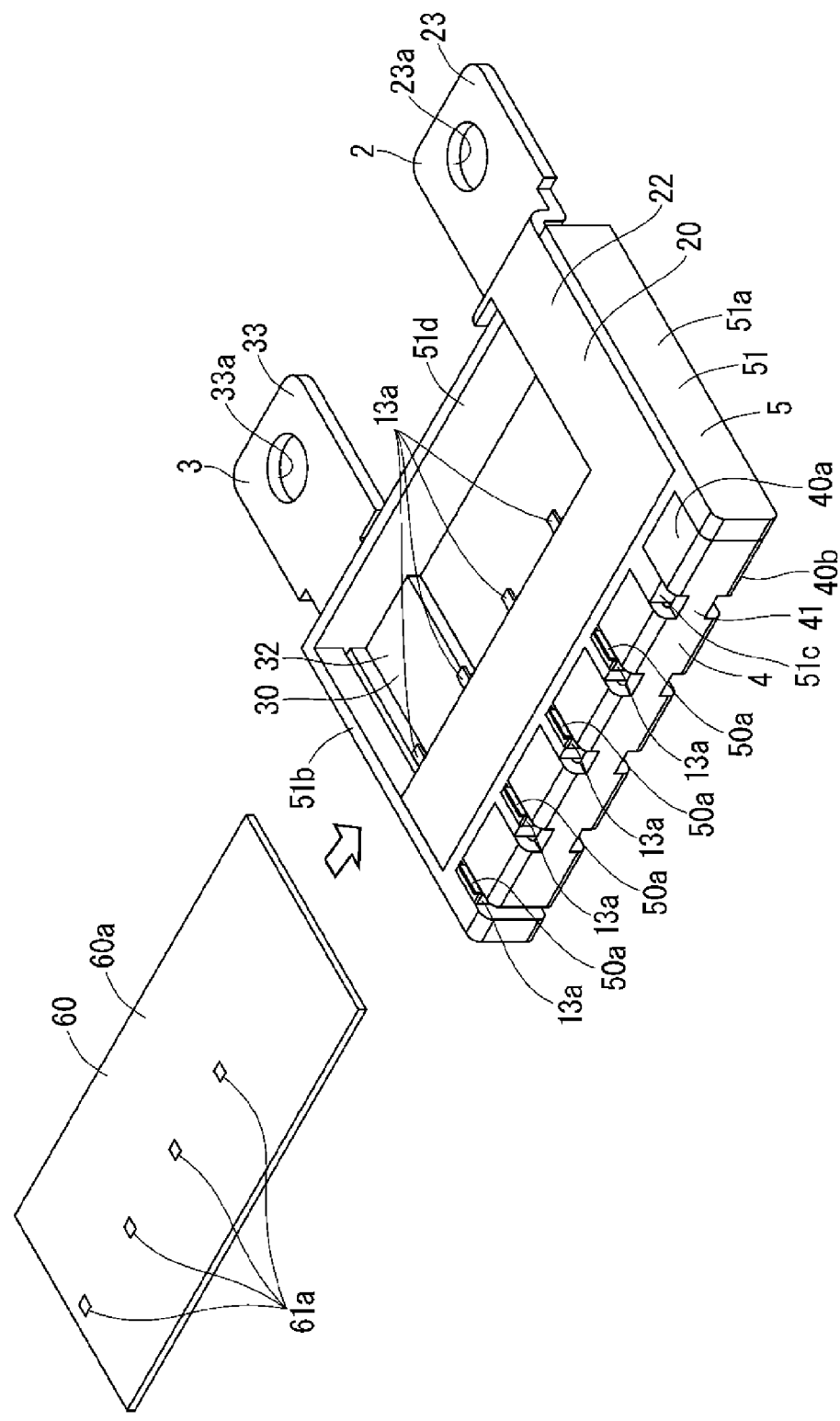
FIG. 18 is a schematic diagram for describing an example of the method for manufacturing the circuit structural body.
Figure 19:
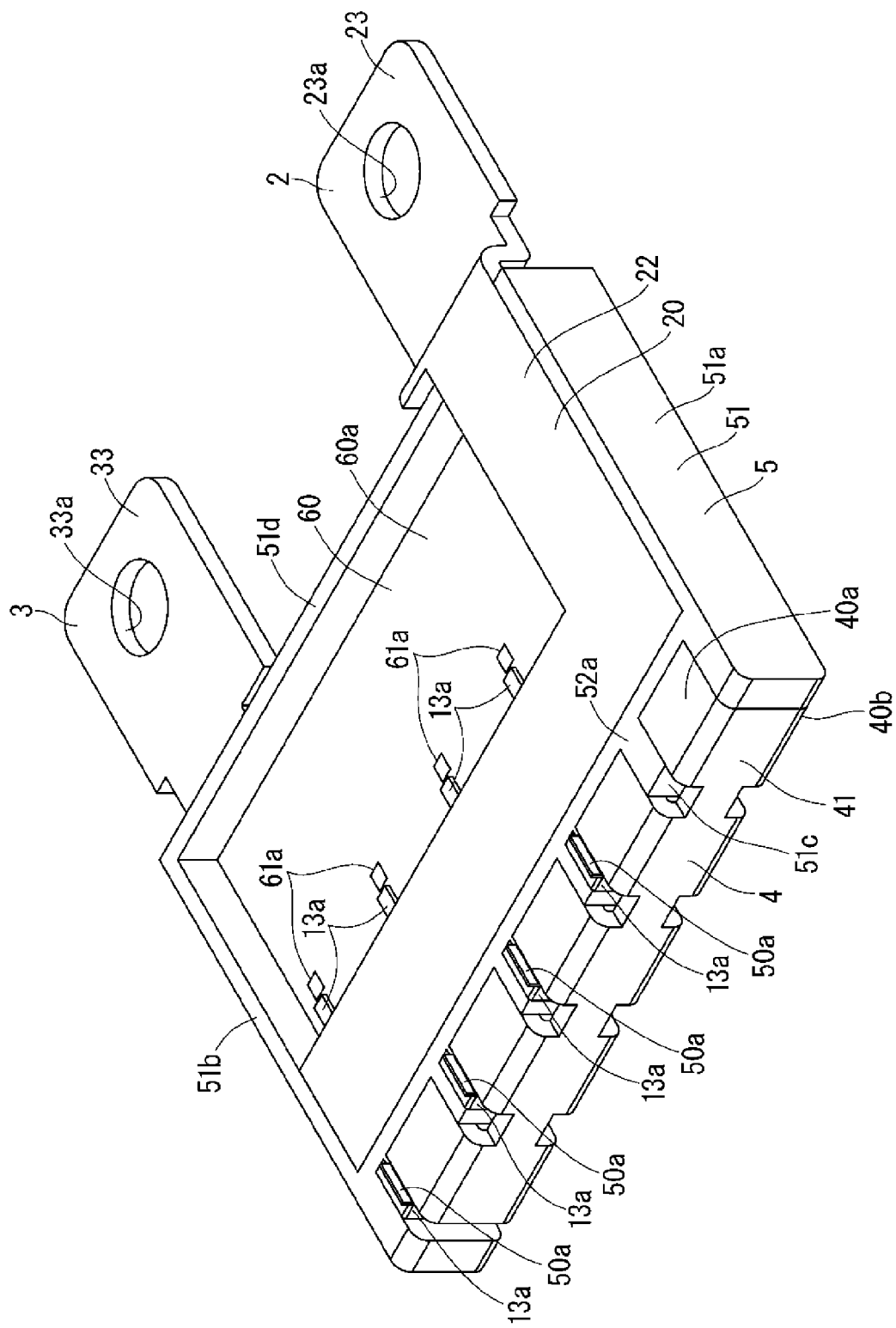
FIG. 19 is a schematic diagram for describing an example of the method for manufacturing the circuit structural body.

Next, as shown in FIG. 18, the wiring board 60 is entered into the insulating part 51 through the slit 55 (see FIG. 5) in the second part 51b of the substantially frame-shaped insulating part 51 of the insulating member 5 and is attached to the insulating member 5. Accordingly, as shown in FIG. 19, the wiring board 60 is attached to the integrated molded article in which the busbars 2, 3, and 4, the plurality of conductive terminals 13, and the insulating member 5 are integrally molded. A guide groove is formed on the internal surface of the insulating part 51 such that the wiring board 60 can be disposed at a predetermined position. The outer peripheral edge of the wiring board 60 is held by the guide groove.

Figure 20:
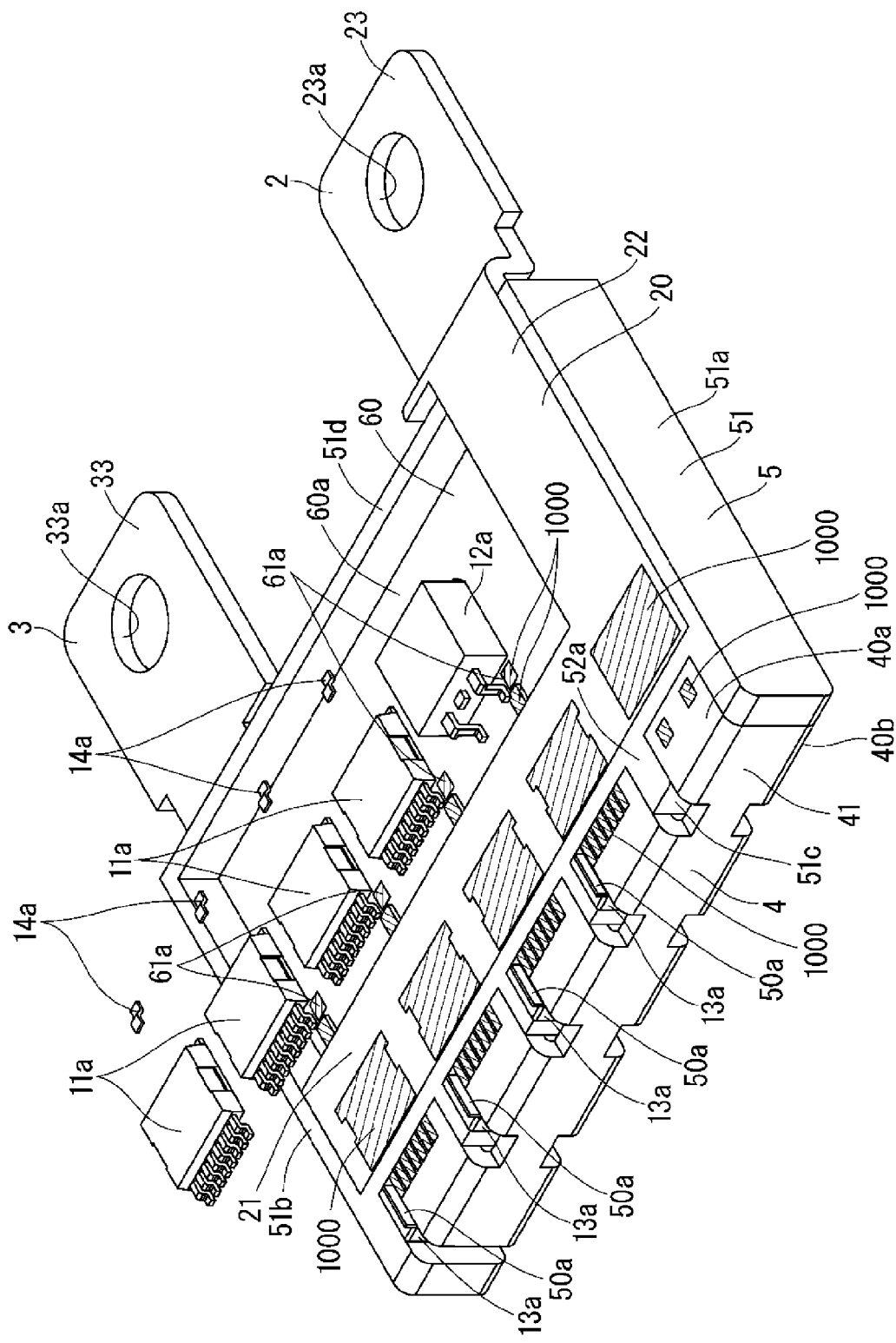
FIG. 20 is a schematic diagram for describing an example of the method for manufacturing the circuit structural body.

Next, as shown in FIG. 20, solder paste 1000 is applied to predetermined regions of the facing part 21 of the busbar 2, predetermined regions of the upper joining target parts 40a of the busbar 4, predetermined regions of the conductive terminals 13a, and predetermined regions (the lands 61a and the like) of the upper surface 60a of the wiring board 60. The solder paste 1000 is applied by using a constant delivery device (also called a "dispenser"), for example. The solder paste is indicated in FIG. 20 using oblique lines. The plurality of MOSFETs 11a, the Zener diode 12a, and the plurality of conductive pieces 14a are mounted in the regions to which the solder paste 1000 is applied, by using a surface-mounted machine (also called "chip mounter"), for example, and then these components are soldered using a reflow method. At this time, due to the action of the insulating part 50a, the gate terminal 111 and the source terminal 112 next to the gate terminal 111 of each MOSFET 11a are unlikely to cause a short-circuit. In addition, the MOSFET 11a is unlikely to be displaced.

Figure 21:
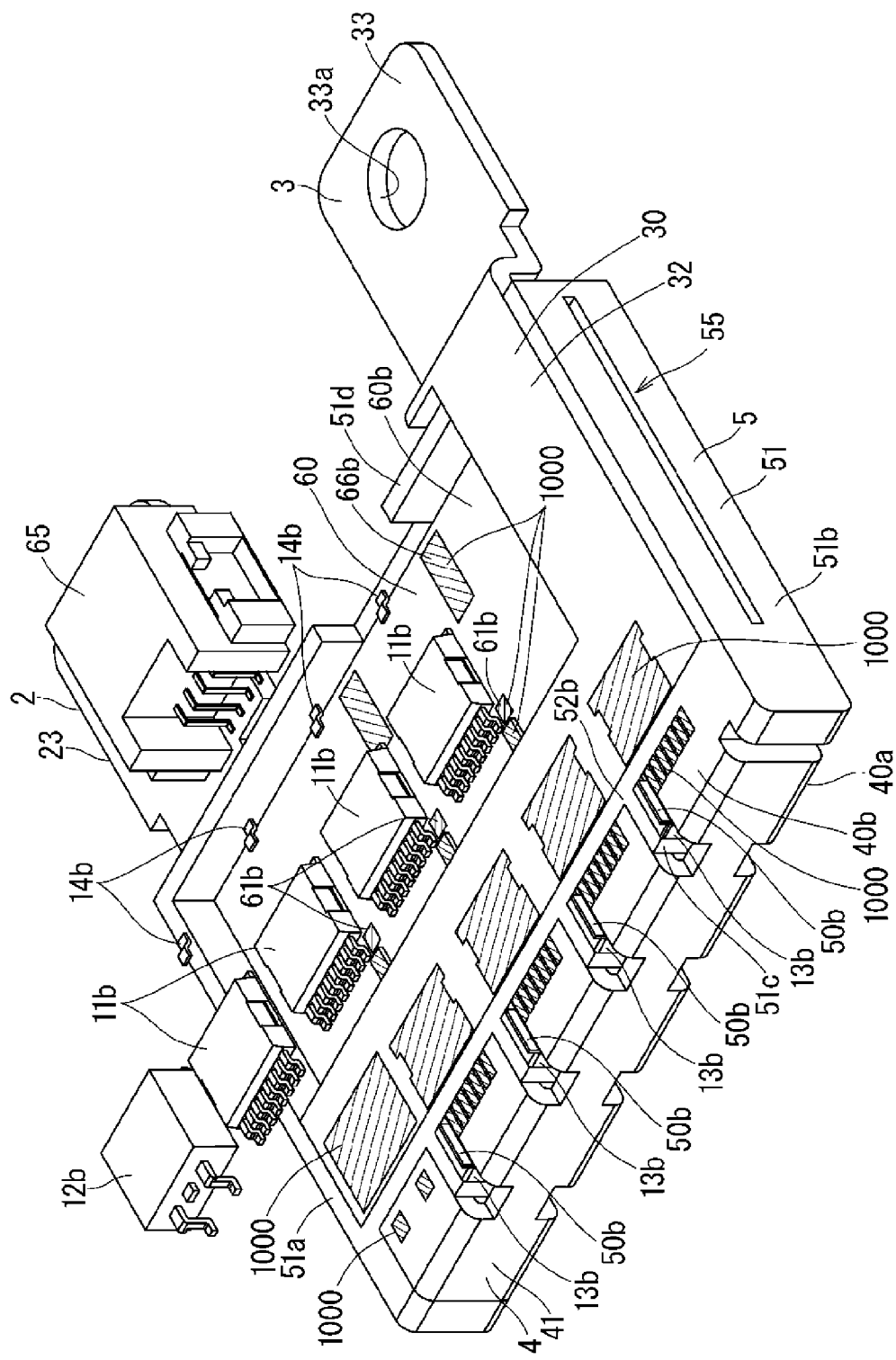
FIG. 21 is a schematic diagram for describing an example of the method for manufacturing the circuit structural body.

Next, as shown in FIG. 21, the solder paste 1000 is applied to predetermined regions on the facing part 31 of the busbar 3, predetermined regions on the lower joining target parts 40b of the busbar 4, predetermined regions on the conductive terminals 13b, and predetermined regions (the plurality of lands 61b, the plurality of lands 66b, and the plurality of lands 67b, and the like) on the lower surface 60b of the wiring board 60. The solder paste 1000 is indicated in FIG. 21 using oblique lines. The plurality of MOSFETs 11b, the Zener diode 12b, the plurality of conductive pieces 14b, the connector 65, and the microcomputer 62 are soldered using a reflow method in the regions to which the solder paste 1000 is applied. At this time, due to the action of the insulating part 50b, the gate terminal 111 and the source terminal 112 next to the gate terminal 111 of each MOSFET 11b are unlikely to cause a short-circuit. In addition, the MOSFET 11b is unlikely to be displaced. FIG. 20 does not show the microcomputer 62.

Figure 22:
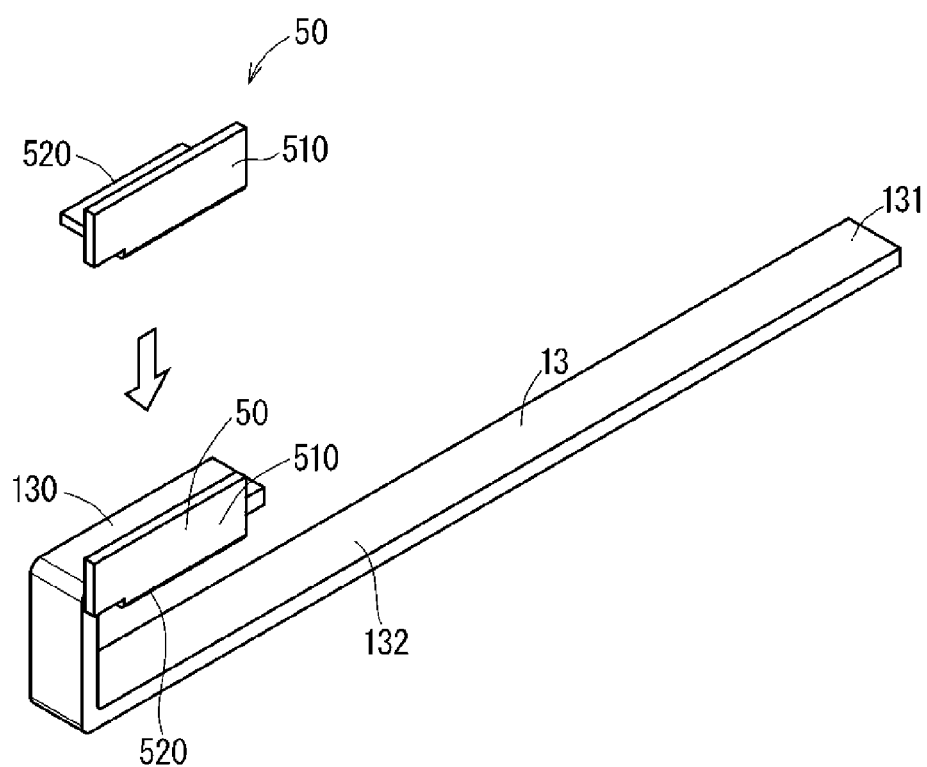
FIG. 22 is a schematic diagram showing an example of a state in which an insulating part is being fixed to a conductive terminal.

As described above, the circuit structural body 10 shown in FIGS. 4 to 12 is manufactured. As shown in FIG. 22, the insulating parts 50 prepared prior to the fabrication of the insulating member 5 may be fixed to the conductive terminals 13, and then the insulating member 5 may be integrally molded through insert molding with the busbars 2, 3, and 4, the plurality of conductive terminals 13, and the plurality of insulating parts 50. In the example of FIG. 22, each insulating part 50 has a shape in which a plate-like member is bent. The insulating part 50 includes a plate-like first part 510 that is positioned between the gate terminal 111 and the source terminal 112 and a plate-like second part 520 that is fixed to the conductive terminal 13, for example. The second part 520 is fixed to the internal surface of the joining target part 130 of the conductive terminal 13. The insulating part 50 may be made of a resin or may be made of ceramic, for example. The insulating part 50 may be made of the same material as that of the insulating member 5 or may be made of a material different from that of the insulating member 5.

Configuration Examples of Case and Heat Dissipation Member

Figure 23:
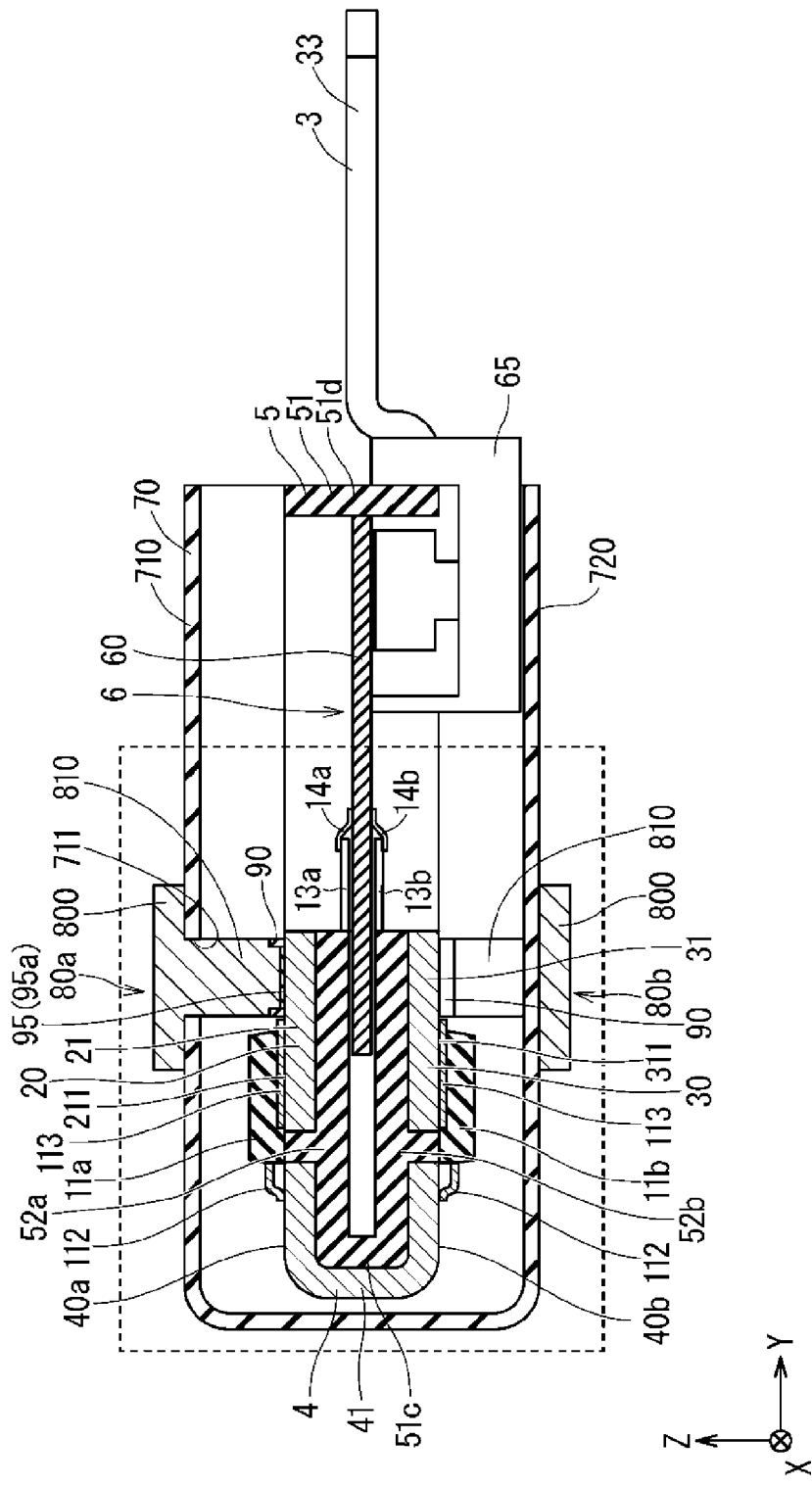
FIG. 23 is a schematic diagram showing an example of a circuit device.
Figure 24:
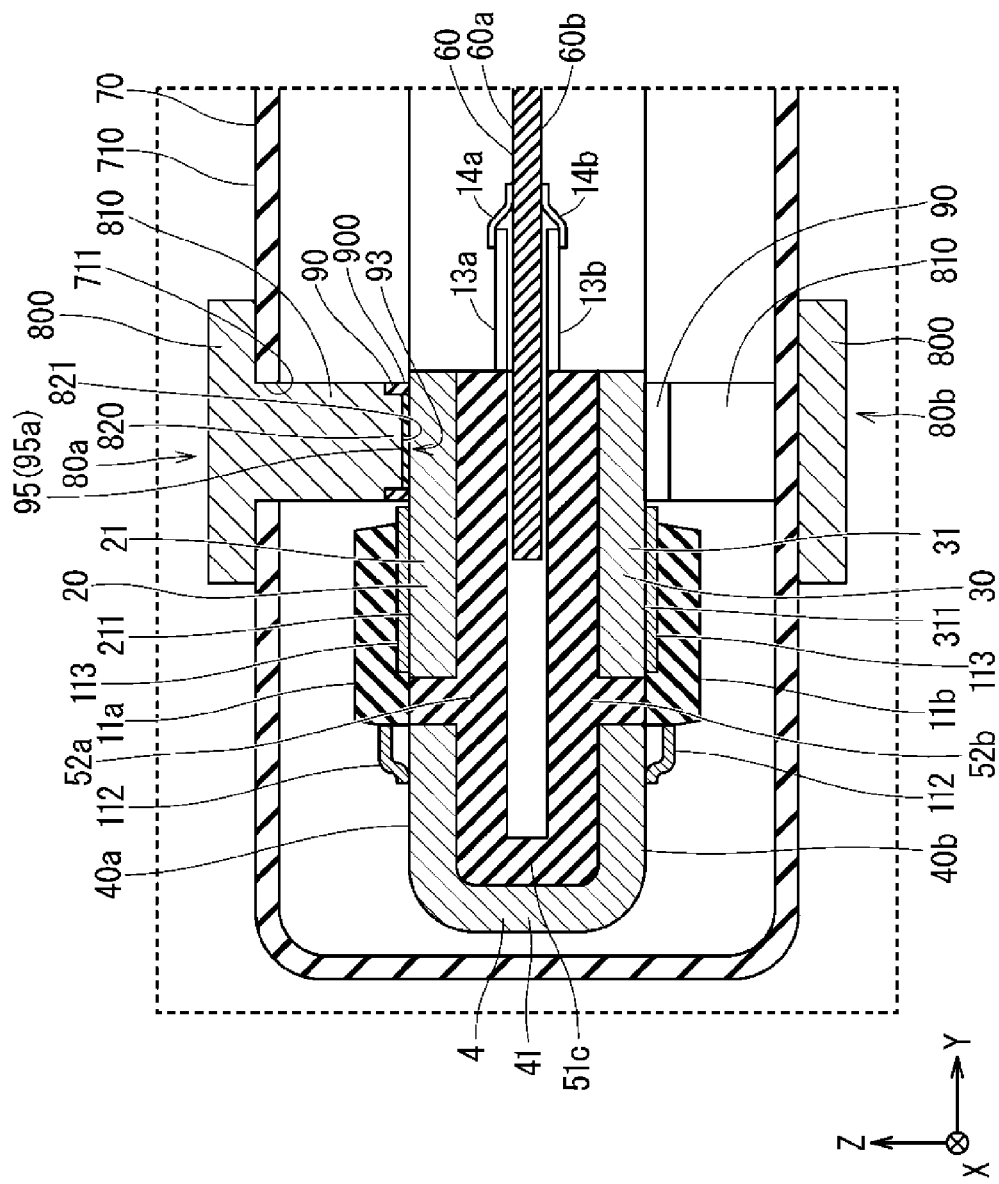
FIG. 24 is a partially enlarged schematic diagram showing an example of the circuit device.
Figure 25:
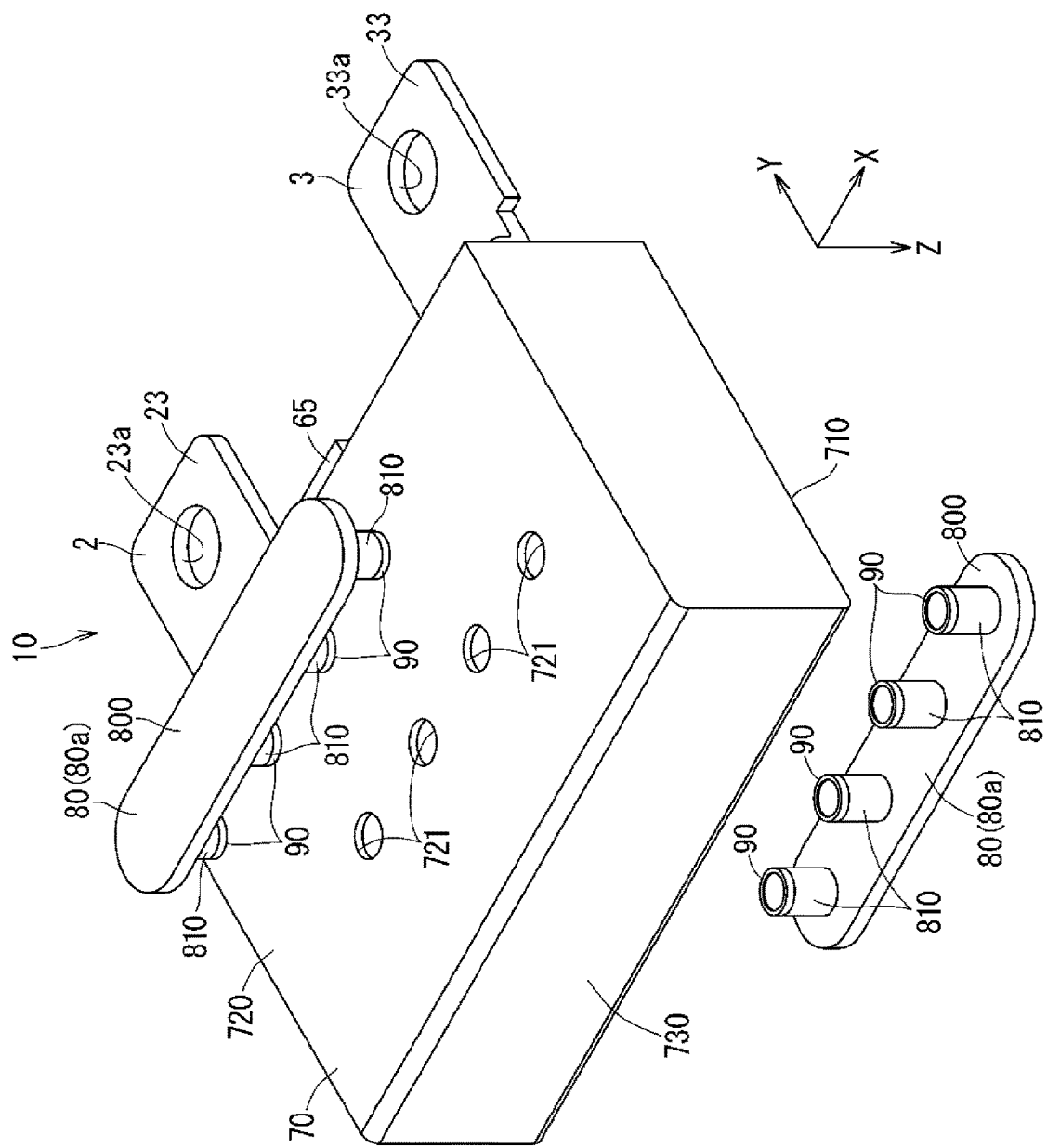
FIG. 25 is a schematic diagram showing an example of the circuit device.
Figure 26:
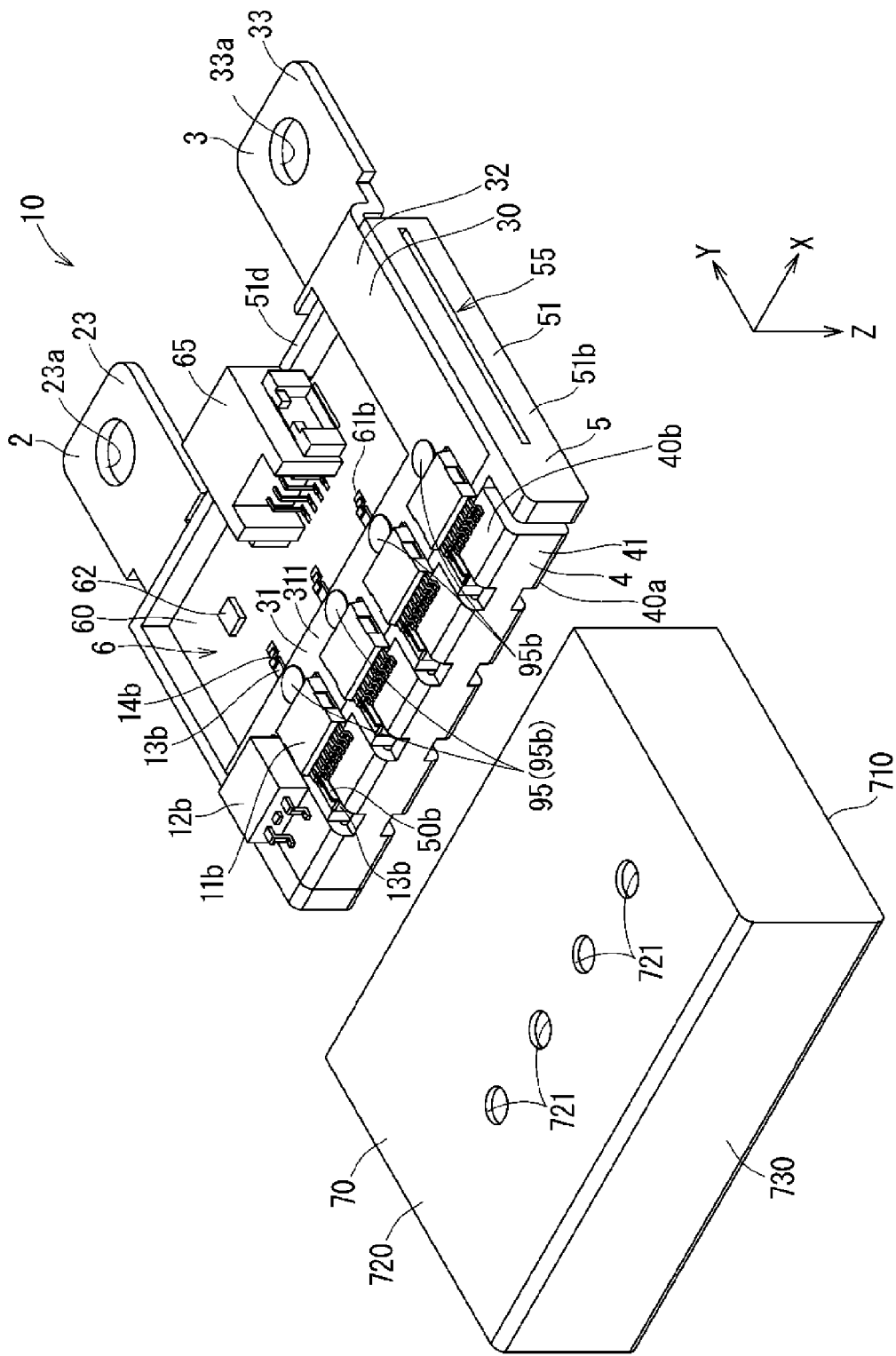
FIG. 26 is a schematic diagram showing an example of a case and the circuit structural body.

FIG. 23 is a diagram showing an example of a cross-sectional structure taken along arrow line D-D in FIG. 1. FIG. 24 is an enlarged schematic view of a part surrounded by a broken line in FIG. 23. FIG. 25 is a schematic perspective diagram showing an example of a state in which the heat dissipation members 80a and 80b are removed from the case 70. FIG. 26 is a schematic perspective diagram showing an example of a state in which the circuit structural body 10 is being removed from the case 70.

As shown in FIGS. 1 to 3, 23 to 26, and the like, the case 70 has a rectangular parallelepiped shape, for example. The case 70 includes an upper wall part 710, a lower wall part 720, and a frame-shaped side wall part 730 that connects the upper wall part 710 and the lower wall part 720, for example. The input terminal part 23 and the output terminal part 33 of the circuit structural body 10 extend from the +Y-side portion of the side wall part 730 to the outside of the case 70. The connector 65 partially extends from the +Y-side portion of the side wall part 730 to the outside of the case 70. The heat dissipation member 80a is fixed to the upper wall part 710, and the heat dissipation member 80b is fixed to the lower wall part 720. The case 70 is made of resin, for example. The case 70 may be made of a PPS resin or may be made of a poly butylene terephthalate (PBT) resin, for example.

The upper wall part 710 has a plurality of through holes 711 that extend therethrough in the thickness direction. The plurality of through holes 711 are lined up in a line along the X direction, for example. The lower wall part 720 has a plurality of through holes 721 that extend therethrough in the thickness direction. The plurality of through holes 721 are lined up in a line along the X direction, for example.

Each heat dissipation member 80 has a plate-like fixation part 800 that is fixed to the outer surface of the case 70 and a plurality of insertion parts 810 that protrude from the fixation part 800, for example. The fixation part 800 is positioned on the outer surface of the case 70. The plurality of insertion parts 810 are provided on the main surface of the fixation part 800 on the case 70 side (in other words, the inner main surface). Each insertion part 810 has a cylindrical shape, for example.

The fixation part 800 of the heat dissipation member 80a is fixed to the outer surface of the upper wall part 710 of the case 70, and the fixation part 800 of the heat dissipation member 80b is fixed to the outer surface of the lower wall part 720 of the case 70. The plurality of insertion parts 810 of the heat dissipation member 80a are respectively inserted into the plurality of insertion holes 711 of the upper wall part 710. The plurality of insertion parts 810 of the heat dissipation member 80b are respectively inserted into the plurality of insertion holes 721 of the lower wall part 720. The heat dissipation member 80 may be made of an aluminum-based alloy, for example, may be made of another metallic material, or may be made of a material other than a metallic material.

A plurality of insulating members 90 are attached to the heat dissipation member 80. The leading end surface of each insertion part 810 of the heat dissipation member 80 is provided with an attachment part 820 to which the insulating member 90 is attached.

Figure 27:
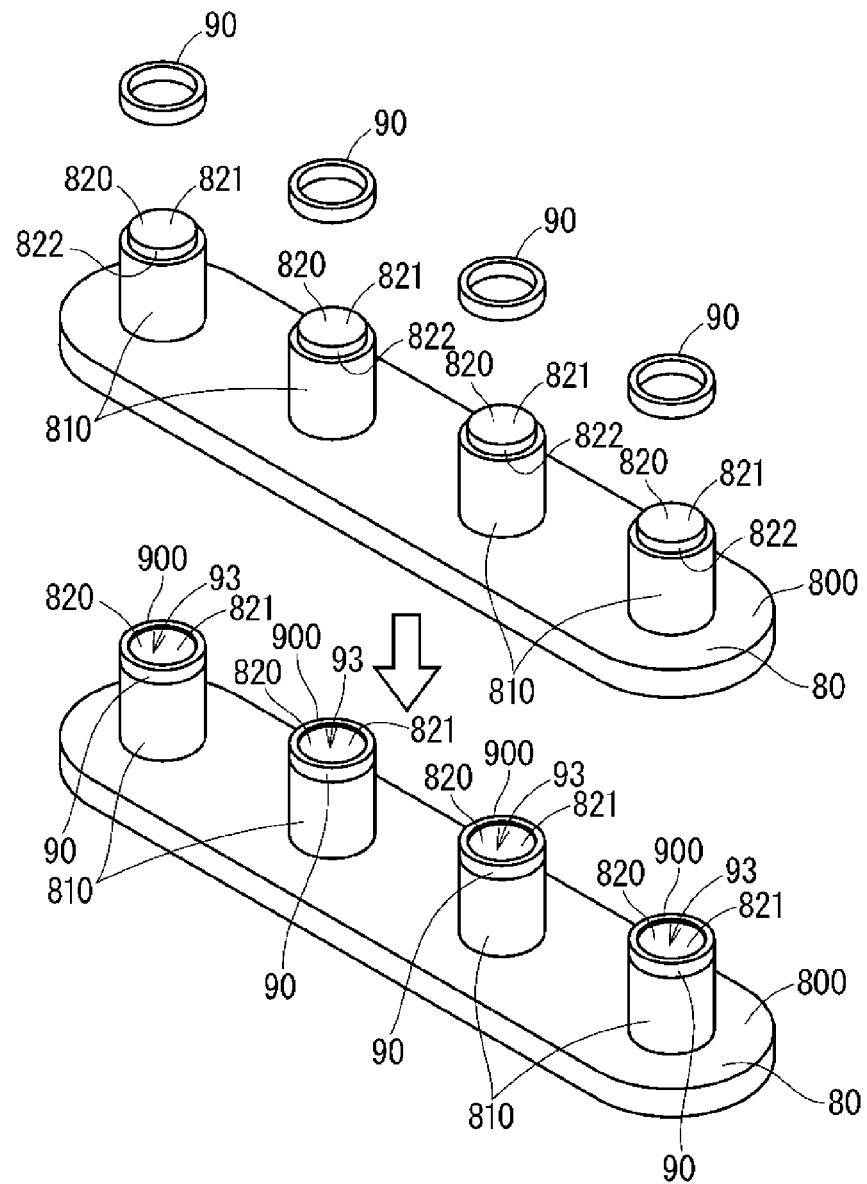
FIG. 27 is a schematic diagram for describing an example of heat dissipation members and insulating members.
Figure 28:
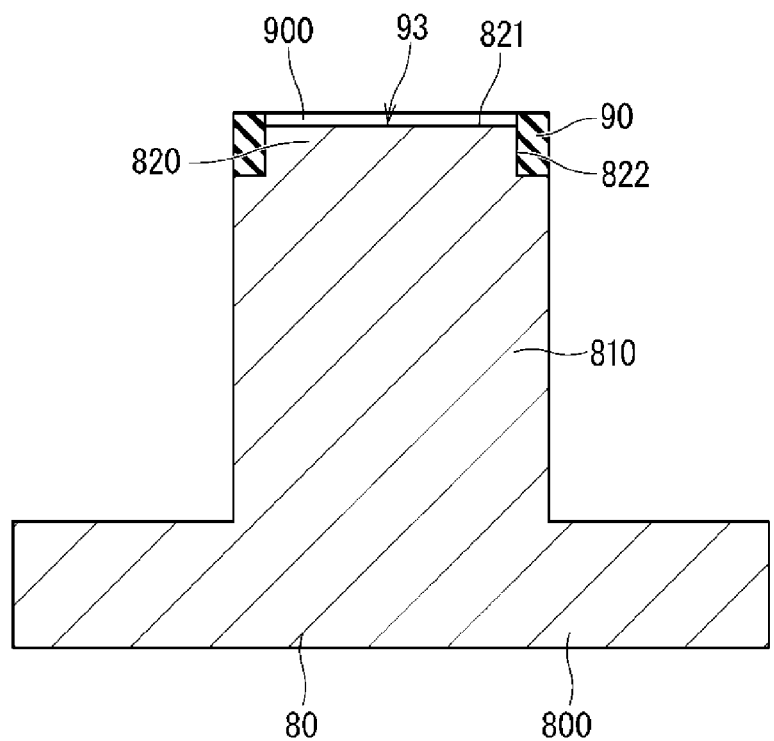
FIG. 28 is a schematic diagram showing an example of a heat dissipation member and an insulating member.

FIG. 27 is a schematic perspective diagram showing an example of a state in which the insulating members 90 are being attached to the attachment parts 820. FIG. 28 is a schematic diagram showing an example of a cross-sectional structure of the heat dissipation member 80 and the insulating member 90 attached to the attachment part 820 of the heat dissipation member 80.

Each attachment part 820 has a disc shape, for example. The attachment part 820 can also be said to have a low-profile cylindrical shape. The attachment part 820 protrudes from the leading end surface (in other words, the circular surface of the leading end) of the insertion part 810, and can also be called a "projection part". The diameter of the disc-shaped attachment part 820 is smaller than the diameter of the cylindrical insertion part 810. The central axis of the attachment part 820 aligns with the central axis of the insertion part 810. The heat dissipation member 80 has a reduced height around the attachment part 820. The surface of the attachment part 820 has a circular main surface 821 and an annular peripheral end surface 822 connected to the peripheral edge of the main surface 821.

Each insulating member 90 has an annular shape, for example. The insulating member 90 may be made of a PPS resin, for example, may be made of another kind of resin, or may be made of an insulating material other than a resin. The annular insulating member 90 is fitted to the attachment part 820 so as to be in contact with the peripheral end surface 822 of the attachment part 820 while surrounding the peripheral end surface 822. The inner diameter of the annular insulating member 90 is made slightly smaller than the diameter of the disc-shaped attachment part 820 so that the insulating member 90 fitted to the attachment part 820 is unlikely to come off from the attachment part 820. The outer diameter of the insulating member 90 is the same as the diameter of the cylindrical insertion part 810, for example. Accordingly, when the insulating member 90 is fitted to the attachment part 820, the insulating member 90 does not protrude outward beyond the insertion part 810. The annular insulating member 90 is slightly higher than the disc-shaped attachment part 820. The insulating member 90 has an annular protruding part 900 that protrudes past the main surface 821 of the attachment part 820 while surrounding the peripheral edge of the main surface 821. The main surface 821 of the attachment part 820 and the annular protruding part 900 of the insulating member 90 attached to the attachment part 820 constitute a recessed part 93. The peripheral wall part of the recessed part 93 is formed by the annular protruding part 900, and the bottom surface of the recessed part 93 is formed by the main surface 821.

In this example, the circuit device 1 includes a plurality of heat conduction materials 95 that correspond to the plurality of MOSFETs 11. The plurality of heat conduction materials 95 include a plurality of heat conduction materials 95a that correspond to the plurality of upper MOSFETs 11a and a plurality of heat conduction materials 95b that correspond to the plurality of lower MOSFETs 11b. The heat conduction materials 95 are constituted by thermal grease, for example. The thermal grease is a heat-conductive silicone grease with a thermal conductivity of 2 W/m K or more and a viscosity of 50 to 500 Pa s, for example. The heat conduction materials 95 may be constituted by a heat conduction sheet or may be constituted by another kind of thermal interface material (TIM).

The plurality of heat conduction materials 95a are arranged in a line along the X direction on the outer surface 211 of the facing part 21 of the busbar 2, for example. The plurality of heat conduction materials 95b are arranged in a line along the X direction on the outer surface 311 of the facing part 31 of the busbar 3, for example (see FIG. 26). The heat conduction materials 95 are arranged near the corresponding MOSFETs 11, for example. The heat conduction materials 95a are arranged near the drain terminals 113 of the corresponding MOSFETs 11a on the +Y side of the drain terminals 113, for example. The heat conduction materials 95b are arranged near the drain terminals 113 of the corresponding MOSFETs 11b on the +Y side of the drain terminals 113, for example.

The plurality of through holes 711 in the upper wall part 710 of the case 70 are positioned immediately above the plurality of heat conduction materials 95a. When the plurality of insertion parts 810 of the heat dissipation member 80a are inserted into the plurality of through holes 711, the main surfaces 821 of the plurality of attachment parts 820 of the heat dissipation member 80a come into contact with the plurality of heat conduction materials 95a. The insulating members 90 attached to the attachment parts 820 of the heat dissipation member 80a are in contact with the outer surface 211 of the facing part 21 of the busbar 2, for example. Each recessed part 93 formed by the main surface 821 of the attachment part 820 (in other words, the contact surface 821 in contact with the heat conduction material 95a) and the annular protruding part 900 of the insulating member 90 attached to the attachment part 820 is filled with the heat conduction material 95a. The heat conduction material 95a has a filling part that fills the recessed part 93. The heat conduction material 95a may have a part that is not positioned in the recessed part 93 but is positioned outside the annular protruding part 900.

The plurality of through holes 721 in the lower wall part 720 of the case 70 are positioned immediately above the plurality of heat conduction materials 95b. When the plurality of insertion parts 810 of the heat dissipation member 80b are inserted into the plurality of through holes 721, the main surfaces 821 of the plurality of attachment parts 820 of the heat dissipation member 80b come into contact with the plurality of heat conduction materials 95b. The insulating members 90 attached to the attachment parts 820 of the heat dissipation member 80b are in contact with the outer surface 311 of the facing part 31 of the busbar 3, for example. Each recessed part 93 formed by the main surface 821 of the attachment part 820 (in other words, the contact surface 821 in contact with the heat conduction material 95a) and the annular protruding part 900 of the insulating member 90 attached to the attachment part 820 is filled with the heat conduction material 95b. The heat conduction material 95b has a filling part that fills the recessed part 93. The heat conduction material 95b may have a part that is not positioned in the recessed part 93 but is positioned outside of the annular protruding part 900.

Figure 29:
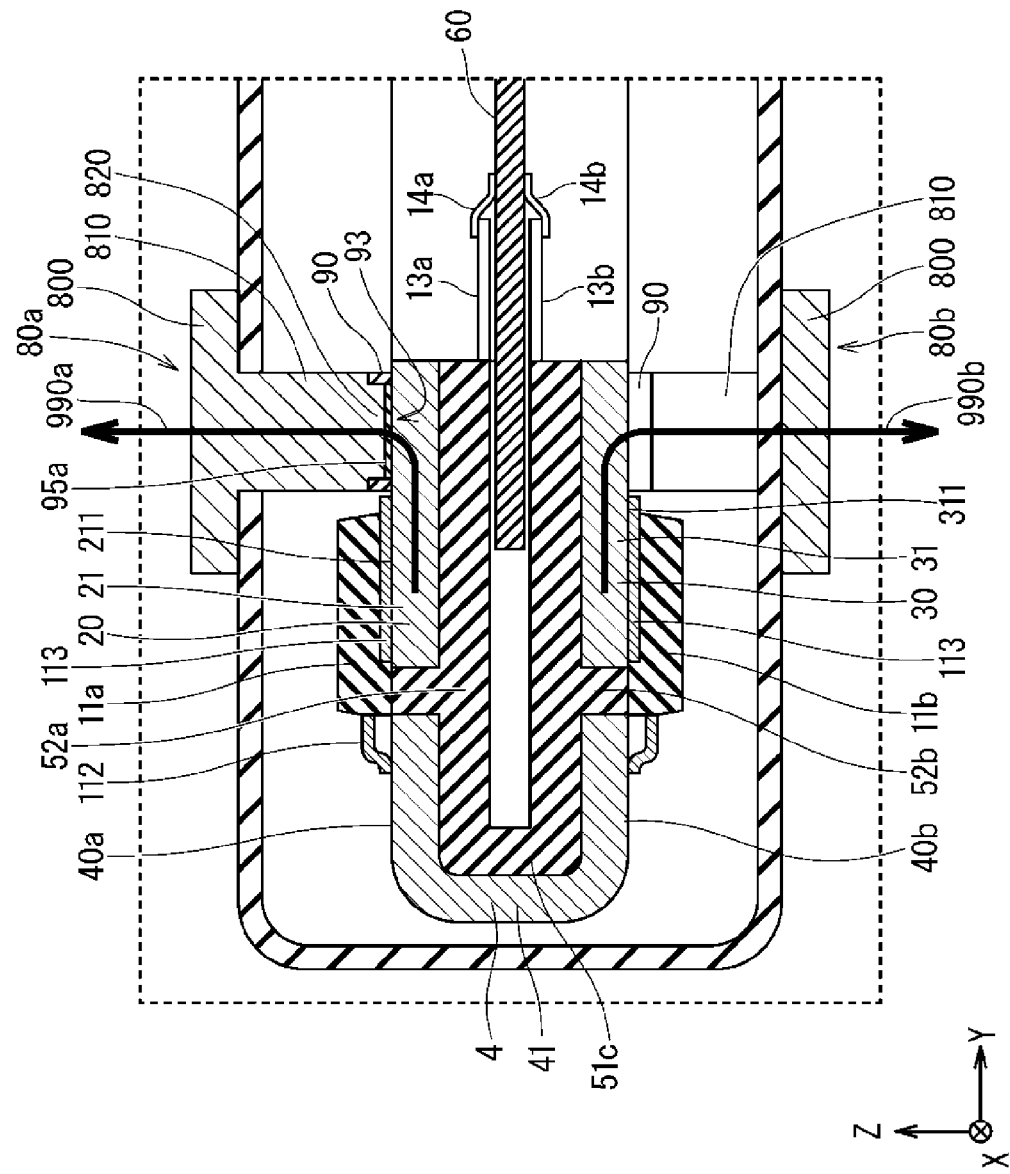
FIG. 29 is a schematic diagram for describing an example of heat transfer paths.

FIG. 29 is a schematic diagram showing an example of heat transfer paths of heat generated by the MOSFETs 11.

Arrow 990a in FIG. 29 indicates the heat transfer path of heat generated by the MOSFETs 11a. Arrow 990b in FIG. 29 indicates the heat transfer path of heat generated by the MOSFETs 11b.

As indicated by the arrow 990a, the heat generated by the MOSFETs 11a is transferred in sequence to the facing part 21 of the busbar 2, the heat conduction material 95a, the attachment part 820 of the heat dissipation member 80a, the insertion part 810 of the heat dissipation member 80a, and the fixation part 800 of the heat dissipation member 80a, and is released to the outside of the circuit device 1.

On the other hand, as shown with the arrow 990b, the heat generated by the MOSFETs 11b is transferred in sequence to the facing part 31 of the busbar 3, the heat conduction material 95b, the attachment part 820 of the heat dissipation member 80b, the insertion part 810 of the heat dissipation member 80b, and the fixation part 800 of the heat dissipation member 80b, and is released to the outside of the circuit device 1.

After the circuit structural body 10 is manufactured as described above, the plurality of heat conduction materials 95a are applied to the outer surface 211 of the facing part 21 of the busbar 2, and the plurality of heat conduction materials 95b are applied to the outer surface 311 of the facing part 31 of the busbar 3. Then, once the circuit structural body 10 is housed in the case 70, the heat dissipation member 80a to which the plurality of insulating members 90 are attached and the heat dissipation member 80b to which the plurality of insulating members 90 are attached are attached to the case 70. At this time, the plurality of recessed parts 93 formed by the heat dissipation member 80 and the plurality of insulating members 90 attached to the heat dissipation member 80 are filled with the heat conduction materials 95. Accordingly, the circuit device 1 shown in FIGS. 1 to 3 is completed. As a waterproofing measure, after the heat dissipation members 80a and 80b are attached to the case 70, a potting agent made of a resin or the like may be filled into the case 70 and then hardened.

As described above, in this example, the MOSFETs 11a are mounted on the facing part 21 of the busbar 2, and the MOSFETs 11b are mounted on the facing part 31 of the busbar 3. That is, the MOSFETs 11a and the MOSFETs 11b are correspondingly mounted on the facing part 21 and the facing part 31 that oppose each other. Accordingly, the plane size of the circuit device 1 can be reduced as seen from the facing part 21 side (in other words, the +Z side) or as seen from the facing part 31 side (in other words, the −Z side). That is, the circuit device 1 can be downsized.

In this example, the heat generated by the MOSFETs 11a is transferred to the heat dissipation member 80a through the facing part 21 of the busbar 2, and is released from the heat dissipation member 80a to the outside. The heat generated by the MOSFETs 11b is transferred to the heat dissipation member 80b through the facing part 31 of the busbar 3, and is released from the heat dissipation member 80b to the outside. When the facing part 31 side (in other words, the −Z side) is seen from the facing part 21 side (in other words, the +Z side), the wiring board 60 is positioned behind the facing part 21 and is positioned in front of the facing part 31. The MOSFETs 11a are mounted on the outer surface 211 of the facing part 21 on the side opposite to the inner surface 212 on the facing part 31 side, and the MOSFETs 11b are mounted on the outer surface 311 of the facing part 31 on the side opposite to the inner surface 312 on the facing part 21 side. Therefore, the wiring board 60 is positioned on the side opposite to the MOSFETs 11a with respect to the facing part 21, and is positioned on the side opposite to the MOSFETs 11b with respect to the facing part 31. Accordingly, the wiring board 60 is less susceptible to heat generated by the MOSFETs 11a and heat generated by the MOSFETs 11b (see the arrows 990a and 990b in FIG. 29). This increases the reliability of the circuit board 6.

In this example, the heat dissipation member 80a and the heat dissipation member 80b have parts that are positioned on the outer surface of the case 70 (the fixation parts 800 in the foregoing example). Accordingly, the heat dissipation properties of the heat dissipation member 80a and the heat dissipation member 80b can be adjusted by adjusting the sizes of the parts without affecting the component arrangement and the like in the case 70.

In this example, the heat dissipation member 80a is in contact with the heat conduction materials 95a that are positioned on the outer surface 211 of the facing part 21 of the busbar 2 opposite to the inner surface 212 on the wiring board 60 side. Accordingly, it is possible to shorten the heat transfer path from the MOSFETs 11a to the heat dissipation member 80a while avoiding interference between the heat dissipation member 80a and the wiring board 60. This increases the heat dissipation properties of the circuit device 1.

Similarly, in this example, the heat dissipation member 80b is in contact with the heat conduction materials 95b that are positioned on the outer surface 311 of the facing part 31 of the busbar 3 opposite to the inner surface 312 on the wiring board 60 side. Accordingly, it is possible to shorten the heat transfer path from the MOSFETs 11b to the heat dissipation member 80b while avoiding interference between the heat dissipation member 80b and the wiring board 60. This increases the heat dissipation properties of the circuit device 1.

In this example, the heat dissipation member 80a is in contact with the plurality of heat conduction materials 95a positioned near the plurality of MOSFETs 11a. Thus, it is possible to shorten the heat transfer path of each MOSFET 11a from the MOSFET 11a to the heat dissipation member 80a. This increases the heat dissipation properties of the circuit device 1.

Similarly, in this example, the heat dissipation member 80b is in contact with the plurality of heat conduction materials 95b positioned near the plurality of MOSFETs 11b. Thus, it is possible to shorten the heat transfer path of each MOSFET 11b from the MOSFET 11b to the heat dissipation member 80b. This increases the heat dissipation properties of the circuit device 1.

In this example, each heat conduction material 95a has the filling part that fills the recessed part 93 formed by the contact surface 821 of the heat dissipation member 80a in contact with the heat conduction material 95a and the annular protruding part 900 of the insulating member 90. Accordingly, the heat dissipation member 80a can be appropriately brought into contact with the heat conduction materials 95a. This increase the heat dissipation properties of the circuit device 1.

Similarly, in this example, each heat conduction material 95b has the filling part that fills the recessed part 93 formed by the contact surface 821 of the heat dissipation member 80b and the annular protruding part 900 of the insulating member 90. Accordingly, the heat dissipation member 80b can be appropriately brought into contact with the heat conduction materials 95b. This improves the heat dissipation performance of the circuit device 1.

Other Examples of Circuit Device

The structure of the circuit device 1 is not limited to the foregoing examples. For example, the shapes of the busbars 2, 3, and 4 are not limited to the foregoing example. The shape of the wiring board 60 is not limited to the foregoing example. In the foregoing example, the wiring board 60 has a part that is sandwiched between the facing part 21 of the busbar 2 and the facing part 31 of the busbar 3 in the Z direction, but the wiring board 60 may not have such a part. When the facing part 31 side is seen from the facing part 21 side, the wiring board 60 may not be positioned behind the facing part 21 and may not be positioned in front of the facing part 31. The MOSFETs 11a may be mounted on the second part 22 of the busbar 2, and the MOSFETs 11b may be mounted on the second part 32 of the busbar 3. The shape of the heat dissipation members 80 is not limited to the foregoing example. For example, if the amount of heat generated by the MOSFETs 11a is large, the fixation part 800 of the heat dissipation member 80a may be provided on the entire outer surface of the upper wall part 710 of the case 70. If the amount of heat generated by the MOSFETs 11b is large, the fixation part 800 of the heat dissipation member 80b may be provided on the entire outer surface of the lower wall part 720 of the case 70. The number of heat conduction materials 95 is not limited to the foregoing example. For example, one heat conduction material 95a may be provided on the busbar 2, and one heat conduction material 95b may be provided on the busbar 3. The circuit device 1 may not include the insulating members 90. The circuit device 1 may not include the insulating parts 50.

As described above, the circuit device 1 has been described in detail. However, the foregoing description is illustrative in all respects and the present disclosure is not limited to the foregoing description. The various modifications described above can be combined with one another, provided no contradiction arises. An infinite number of modifications not illustrated herein can be contemplated without deviating from the scope of the present disclosure.

The invention claimed is:

1. A circuit device comprising:
 a first electronic component;
 a first busbar on which the first electronic component is mounted;
 a second electronic component;
 a second busbar on which the second electronic component is mounted;
 a first heat dissipation member that is thermally connected to the first busbar;
 a second heat dissipation member that is thermally connected to the second busbar; and
 a circuit board that is electrically connected to the first electronic component and the second electronic component,
 wherein the first busbar and the second busbar respectively have a first facing part and a second facing part that face each other,
 the first facing part has a first surface on which the first electronic component is mounted and a second surface opposite to the first surface,
 the second facing part has a third surface that faces the second surface of the first facing part and a fourth surface that is positioned opposite to the third surface and on which the second electronic component is mounted, and
 when the second facing part is seen from the first facing part, the circuit board has a wiring board that is positioned behind the first facing part and is positioned in front of the second facing part.

2. The circuit device according to claim 1, further comprising
 a case that houses the first electronic component, the second electronic component, the first facing part, the second facing part, and the circuit board,
 wherein each of the first heat dissipation member and the second heat dissipation member has a part positioned on an outer surface of the case.

3. The circuit device according to claim 1, further comprising
 a first heat conduction material that is positioned on the first surface of the first facing part,
 wherein the first heat dissipation member is in contact with the first heat conduction material.

4. The circuit device according to claim 3, further comprising:
 a third electronic component that is mounted on the first surface of the first facing part; and
 a second heat conduction material that is positioned on the first surface of the first facing part,
 wherein the first heat conduction material is positioned near the first electronic component,
 the second heat conduction material is positioned near the third electronic component, and
 the first heat dissipation member is in contact with the first heat conduction material and the second heat conduction material.

5. The circuit device according to claim 3,
 wherein the first heat dissipation member has a contact surface in contact with the first heat conduction material,
 the circuit device further comprises a first insulating member that has an annular protruding part that surrounds a peripheral edge of the contact surface and protrudes toward the first surface past the contact surface, and
 the first heat conduction material has a filling part that fills a recessed part formed by the contact surface and the annular protruding part.

6. The circuit device according to claim 1,
 wherein the first electronic component has a first connection terminal and a second connection terminal that are adjacent to each other,
 the first connection terminal and the second connection terminal are joined by a conductive joining material to a first joining target part and a second joining target part, respectively, and
 the circuit device further comprises an insulating part that is positioned between the first connection terminal and the second connection terminal.

7. The circuit device according to claim 6,
 wherein the first joining target part is included in a conductive terminal that is electrically connected to the circuit board, and
 the circuit device further comprises a bent conductive piece that is joined to the conductive terminal and the circuit board and electrically connects the conductive terminal and the circuit board.

8. The circuit device according to claim 2, further comprising
 a first heat conduction material that is positioned on the first surface of the first facing part,
 wherein the first heat dissipation member is in contact with the first heat conduction material.

9. The circuit device according to claim 4,
 wherein the first heat dissipation member has a contact surface in contact with the first heat conduction material, the circuit device further comprises a first insulating member that has an annular protruding part that surrounds a peripheral edge of the contact surface and protrudes toward the first surface past the contact surface, and the first heat conduction material has a filling part that fills a recessed part formed by the contact surface and the annular protruding part.

10. The circuit device according to claim 2, wherein the first electronic component has a first connection terminal and a second connection terminal that are adjacent to each other, the first connection terminal and the second connection terminal are joined by a conductive joining material to a first joining target part and a second joining target part, respectively, and the circuit device further comprises an insulating part that is positioned between the first connection terminal and the second connection terminal.

11. The circuit device according to claim 3, wherein the first electronic component has a first connection terminal and a second connection terminal that are adjacent to each other, the first connection terminal and the second connection terminal are joined by a conductive joining material to a first joining target part and a second joining target part, respectively, and the circuit device further comprises an insulating part that is positioned between the first connection terminal and the second connection terminal.

12. The circuit device according to claim 4, wherein the first electronic component has a first connection terminal and a second connection terminal that are adjacent to each other, the first connection terminal and the second connection terminal are joined by a conductive joining material to a first joining target part and a second joining target part, respectively, and the circuit device further comprises an insulating part that is positioned between the first connection terminal and the second connection terminal.

13. The circuit device according to claim 5, wherein the first electronic component has a first connection terminal and a second connection terminal that are adjacent to each other, the first connection terminal and the second connection terminal are joined by a conductive joining material to a first joining target part and a second joining target part, respectively, and the circuit device further comprises an insulating part that is positioned between the first connection terminal and the second connection terminal.

\* \* \* \* \*